US010518652B2

(12) United States Patent
    Brown et al.

(10) Patent No.:     US 10,518,652 B2
(45) Date of Patent:      Dec. 31, 2019

(54) FUEL CELL VEHICLE WITH POWER MODULES

(71) Applicant: Toyota Motor Engineering & Manufacturing North America, Inc., Plano, TX (US)

(72) Inventors: Sheldon Z. Brown, Ann Arbor, MI (US); Giorgio L. Zoia, Los Angeles, CA (US); Takehito Yokoo, Aliso Viejo, CA (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 15/938,724

(22) Filed: Mar. 28, 2018

(65) Prior Publication Data

US 2018/0339604 A1     Nov. 29, 2018

Related U.S. Application Data

(60) Provisional application No. 62/510,718, filed on May 24, 2017.

(51) Int. Cl.
    *B60L 15/20*     (2006.01)
    *B60L 1/00*      (2006.01)
    (Continued)

(52) U.S. Cl.
    CPC .............. *B60L 15/20* (2013.01); *B60L 1/003* (2013.01); *B60L 3/0053* (2013.01); *B60L 3/12* (2013.01);
    (Continued)

(58) Field of Classification Search
    CPC ...... B60L 15/20; B60L 1/003; B60L 2220/42; B60L 2220/44; B60L 2220/46;
    (Continued)

(56) References Cited

U.S. PATENT DOCUMENTS

| 5,432,418 | A | 7/1995 | Jeanneret |
| 5,758,014 | A | 5/1998 | Young |

(Continued)

FOREIGN PATENT DOCUMENTS

| DE | 3720051 A1 | 12/1988 |
| DE | 102008041463 A1 | 2/2010 |

(Continued)

OTHER PUBLICATIONS

International Search Report and Written Opinion from the International Searching Authority for International Patent Application No. PCT/US2018/034037 dated Oct. 15, 2018 (in English) (13 Pages).

(Continued)

*Primary Examiner* — Babar Sarwar
(74) *Attorney, Agent, or Firm* — Christopher G. Darrow; Darrow Mustafa PC

(57) ABSTRACT

A method of operating a vehicle includes, using a master power control module, and in response to a propulsion demand global to the vehicle, operating a master-assigned motor to which a wheeled drivetrain is mechanically connected to satisfy a share of the propulsion demand. The method additionally includes, using a slave power control module, and in response to the propulsion demand, operating a slave-assigned motor to which the drivetrain is mechanically connected to satisfy a remaining share of the propulsion demand.

18 Claims, 11 Drawing Sheets

(51) Int. Cl.

| | |
|---|---|
| *B60L 3/12* | (2006.01) |
| *G06F 17/50* | (2006.01) |
| *H01M 8/04828* | (2016.01) |
| *B60L 3/00* | (2019.01) |
| *B60L 50/50* | (2019.01) |
| *B60L 50/90* | (2019.01) |
| *B60L 58/30* | (2019.01) |

(52) U.S. Cl.

CPC ............... *B60L 50/50* (2019.02); *B60L 50/90* (2019.02); *B60L 58/30* (2019.02); *G06F 17/5095* (2013.01); *H01M 8/0494* (2013.01); *B60L 2220/42* (2013.01); *B60L 2220/44* (2013.01); *B60L 2220/46* (2013.01); *B60L 2240/42* (2013.01); *H01M 2250/20* (2013.01)

(58) Field of Classification Search

CPC ...... B60L 2240/42; B60L 3/0053; B60L 3/12; B60L 50/50; B60L 50/90; B60L 58/30; G06F 17/5095; H01M 2250/20; H01M 8/0494

See application file for complete search history.

(56) References Cited

U.S. PATENT DOCUMENTS

| | | | |
|---|---|---|---|
| 5,845,731 | A | 12/1998 | Buglione et al. |
| 5,877,564 | A | 3/1999 | Kuiri |
| 6,064,178 | A | 5/2000 | Miller |
| 6,387,556 | B1 | 5/2002 | Fuglevand et al. |
| 7,281,770 | B1 | 10/2007 | Curran et al. |
| 7,338,335 | B1 | 3/2008 | Messano |
| 7,966,945 | B1 | 6/2011 | Miller et al. |
| 8,944,207 | B2 | 2/2015 | Gulan et al. |
| 9,061,599 | B2 * | 6/2015 | Sisk ................... B60L 11/1864 |
| 2003/0037975 | A1 | 2/2003 | Chernoff et al. |
| 2003/0071466 | A1 | 4/2003 | Gale et al. |
| 2004/0040755 | A1 | 3/2004 | Swindell et al. |
| 2004/0086758 | A1 | 5/2004 | Vuk et al. |
| 2005/0023053 | A1 | 2/2005 | Bennett |
| 2005/0084726 | A1 | 4/2005 | Dickman et al. |
| 2006/0101645 | A1 | 5/2006 | Stone |
| 2006/0115693 | A1 | 6/2006 | Toth et al. |
| 2006/0207812 | A1 | 9/2006 | Saitou |
| 2007/0087241 | A1 | 4/2007 | Mulvenna et al. |
| 2007/0193289 | A1 | 8/2007 | Matsui et al. |
| 2008/0202829 | A1 * | 8/2008 | Gelinas ................... B60K 6/26 180/65.235 |
| 2008/0277175 | A1 | 11/2008 | Tyler et al. |
| 2009/0250279 | A1 | 10/2009 | Holmes |
| 2009/0305087 | A1 | 12/2009 | Rajashekara et al. |
| 2010/0088441 | A1 * | 4/2010 | Peterson ................. B60L 1/003 710/110 |
| 2011/0073394 | A1 | 3/2011 | Wakatsuki |
| 2011/0288707 | A1 | 11/2011 | Westlake |
| 2012/0249022 | A1 | 10/2012 | Washburn et al. |
| 2012/0296505 | A1 * | 11/2012 | Igarashi ................ B60L 3/0053 701/22 |
| 2012/0319657 | A1 | 12/2012 | Ke et al. |
| 2013/0065089 | A1 | 3/2013 | Kazuno et al. |
| 2013/0241445 | A1 | 9/2013 | Tang |
| 2014/0228165 | A1 * | 8/2014 | Frank ..................... B60K 6/442 477/5 |
| 2015/0008888 | A1 | 1/2015 | Chevalley et al. |
| 2015/0135863 | A1 * | 5/2015 | Dalum ................... B60K 25/00 74/11 |
| 2015/0180231 | A1 | 6/2015 | Whitehouse et al. |
| 2015/0333636 | A1 | 11/2015 | Kurauchi et al. |
| 2016/0052505 | A1 * | 2/2016 | Zhou ........................ B60L 7/14 701/22 |
| 2016/0096434 | A1 | 4/2016 | Nakaoka et al. |
| 2016/0164285 | A1 | 6/2016 | Elliott et al. |
| 2016/0294214 | A1 | 10/2016 | Mosman |
| 2016/0318411 | A1 | 11/2016 | Goetz et al. |
| 2017/0297557 | A1 * | 10/2017 | Askerdal ............... B60W 10/06 |
| 2018/0154773 | A1 * | 6/2018 | Dalum ................... B60K 17/28 |
| 2018/0339604 | A1 * | 11/2018 | Brown ................... B60L 1/003 |

FOREIGN PATENT DOCUMENTS

| | | |
|---|---|---|
| DE | 102012010173 A1 | 11/2012 |
| DE | 102014005290 A1 | 10/2015 |
| JP | 2012178770 A | 9/2012 |
| JP | 2012210003 A | 10/2012 |
| WO | 2016208205 A1 | 12/2016 |

OTHER PUBLICATIONS

International Search Report and Written Opinion from the International Searching Authority for International Patent Application No. PCT/US2018/034038 dated Aug. 21, 2018 (in English) (14 Pages).

International Search Report and Written Opinion from the International Searching Authority for International Patent Application No. PCT/US2018/034039 dated Aug. 21, 2018 (in English) (14 Pages).

* cited by examiner

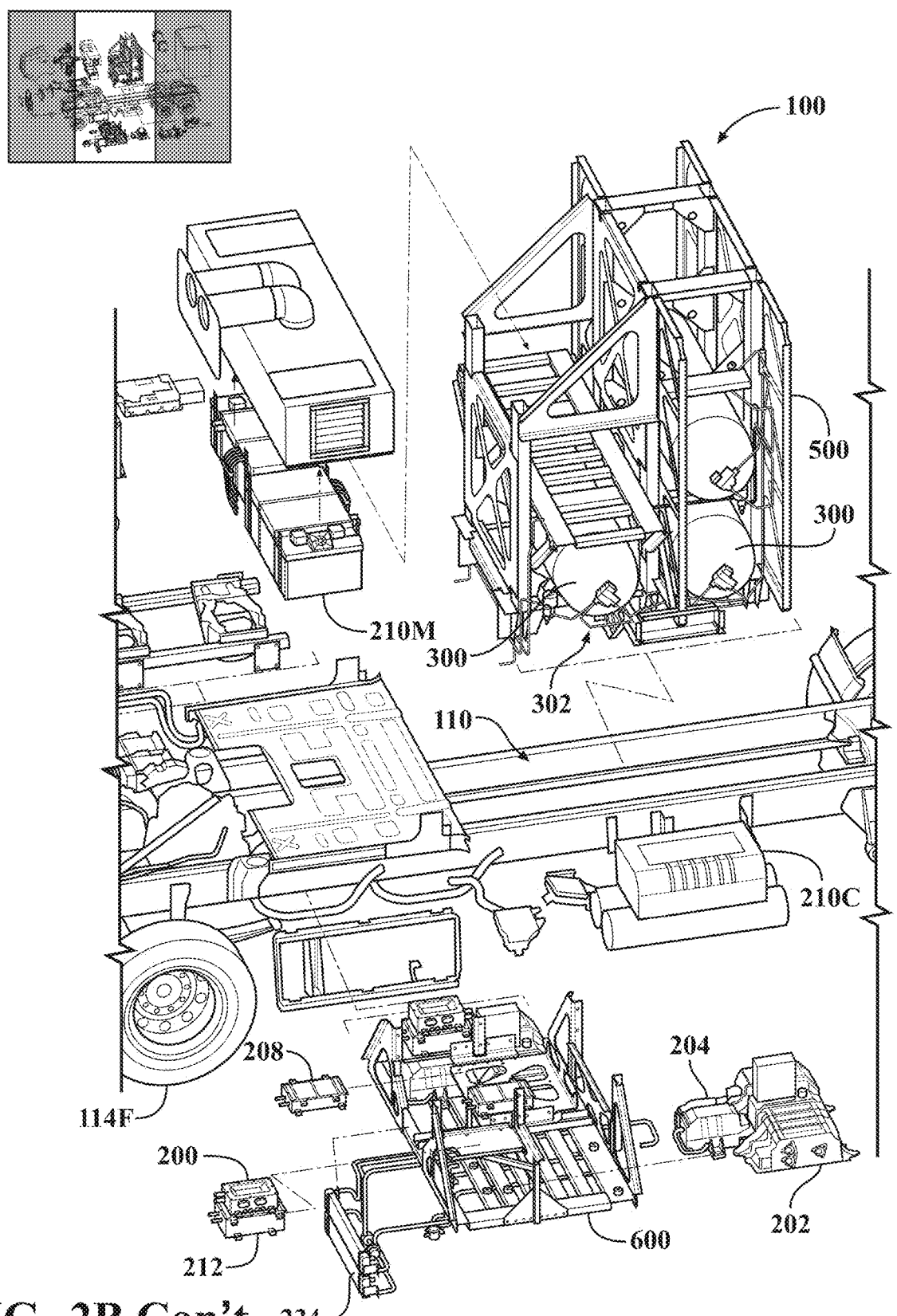
FIG. 2B Con't

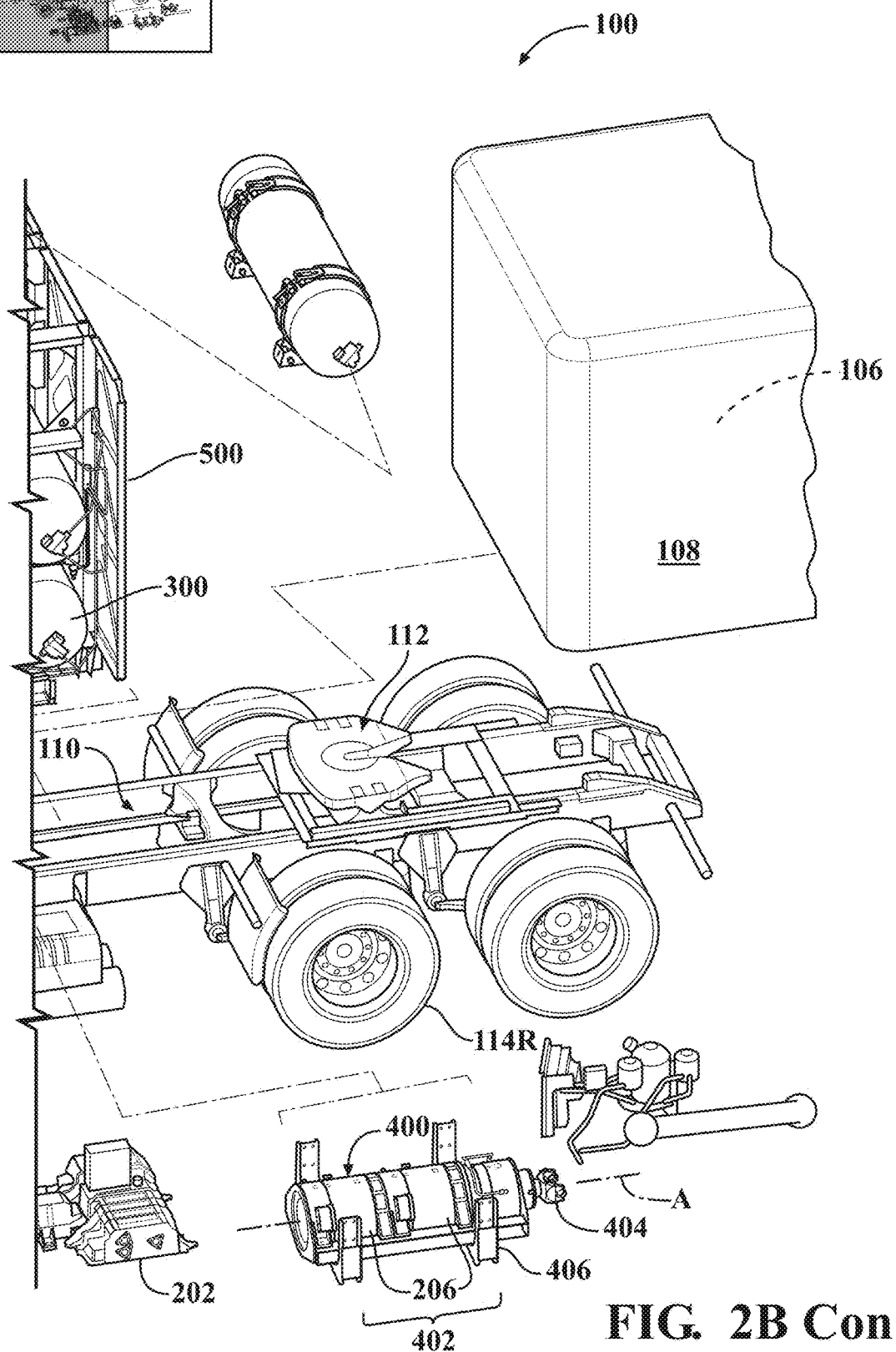
FIG. 2B Con't

FUEL CELL VEHICLE WITH POWER MODULES

CROSS REFERENCE TO RELATED APPLICATIONS

This application claims benefit of U.S. Provisional Application No. 62/510,718, filed on May 24, 2017, which is herein incorporated by reference in its entirety.

TECHNICAL FIELD

The embodiments disclosed herein relate to vehicles and, more particularly, to vehicles that have electrified powertrains.

BACKGROUND

Many vehicles are electrified vehicles or, in other words, vehicles that have an electrified powertrain. The typical electrified vehicle has a more or less traditional drivetrain. Specifically, as part of the drivetrain, the electrified vehicle includes one or more wheels, as well as a transmission, a differential, a drive shaft and the like, to which the wheels are mechanically connected. However, in place of an engine, the electrified vehicle includes one or more motors. And, as part of the electrified powertrain, the drivetrain is mechanically connected to the motors. In conjunction with the drivetrain, the motors are operable to power the wheels using electrical energy. Many electrified vehicles are, moreover, fuel cell vehicles (FCVs) or, in other words, electrified vehicles that include one or more fuel cell stacks. In FCVs, the fuel cell stacks are operable to generate the electrical energy used by the motors to power the wheels.

SUMMARY

Disclosed herein are embodiments of vehicles that include multiple power modules. The vehicle elements belonging to the power modules, as well as certain auxiliary elements, are operated under a master/slave control relationship. In one aspect, a vehicle includes at least one processor, and a memory communicatively coupled to the at least one processor. The memory stores a master power control module and a slave power control module. The master power control module includes instructions that when executed by the at least one processor cause the at least one processor to, in response to a propulsion demand global to the vehicle, operate a master-assigned motor to which a wheeled drivetrain is mechanically connected to satisfy a share of the propulsion demand. The slave power control module includes instructions that when executed by the at least one processor cause the at least one processor to, in response to the propulsion demand, operate a slave-assigned motor to which the drivetrain is mechanically connected to satisfy a remaining share of the propulsion demand.

In another aspect, a method of operating a vehicle includes, using a master power control module, and in response to a propulsion demand global to the vehicle, operating a master-assigned motor to which a wheeled drivetrain is mechanically connected to satisfy a share of the propulsion demand. The method additionally includes, using a slave power control module, and in response to the propulsion demand, operating a slave-assigned motor to which the drivetrain is mechanically connected to satisfy a remaining share of the propulsion demand.

In yet another aspect, a vehicle includes at least one processor, and a memory communicatively coupled to the at least one processor. The memory stores a master power control module and a slave power control module. The master power control module includes instructions that when executed by the at least one processor cause the at least one processor to monitor for vehicle demands global to the vehicle based on actual information about the vehicle, and thereby identify an auxiliary demand global to the vehicle, and perform additional tasks in response to identifying the auxiliary demand. The additional tasks include identifying a master-assigned auxiliary demand and a slave-assigned auxiliary demand, and operating a master-assigned auxiliary element to satisfy the master-assigned auxiliary demand. The additional tasks also include generating simulated information about the vehicle for the slave power control module. The simulated information about the vehicle is indicative of the slave-assigned auxiliary demand, but not the master-assigned auxiliary demand. The slave power control module includes instructions that when executed by the at least one processor cause the at least one processor to independently monitor for vehicle demands global to the vehicle based on the simulated information about the vehicle, and thereby identify only the slave-assigned auxiliary demand, and perform additional tasks in response to identifying the slave-assigned auxiliary demand. The additional tasks include operating a slave-assigned auxiliary element to satisfy the slave-assigned auxiliary demand.

These and other aspects will be described in additional detail below.

BRIEF DESCRIPTION OF THE DRAWINGS

The various features, advantages and other uses of the present embodiments will become more apparent by referring to the following detailed description and drawing in which.

DETAILED DESCRIPTION

This disclosure teaches a vehicle that includes multiple power modules. The vehicle elements belonging to the power modules, as well as certain auxiliary elements, are operated under a master/slave control relationship.

Semi-Tractor Fuel Cell Vehicle

Figure 1:
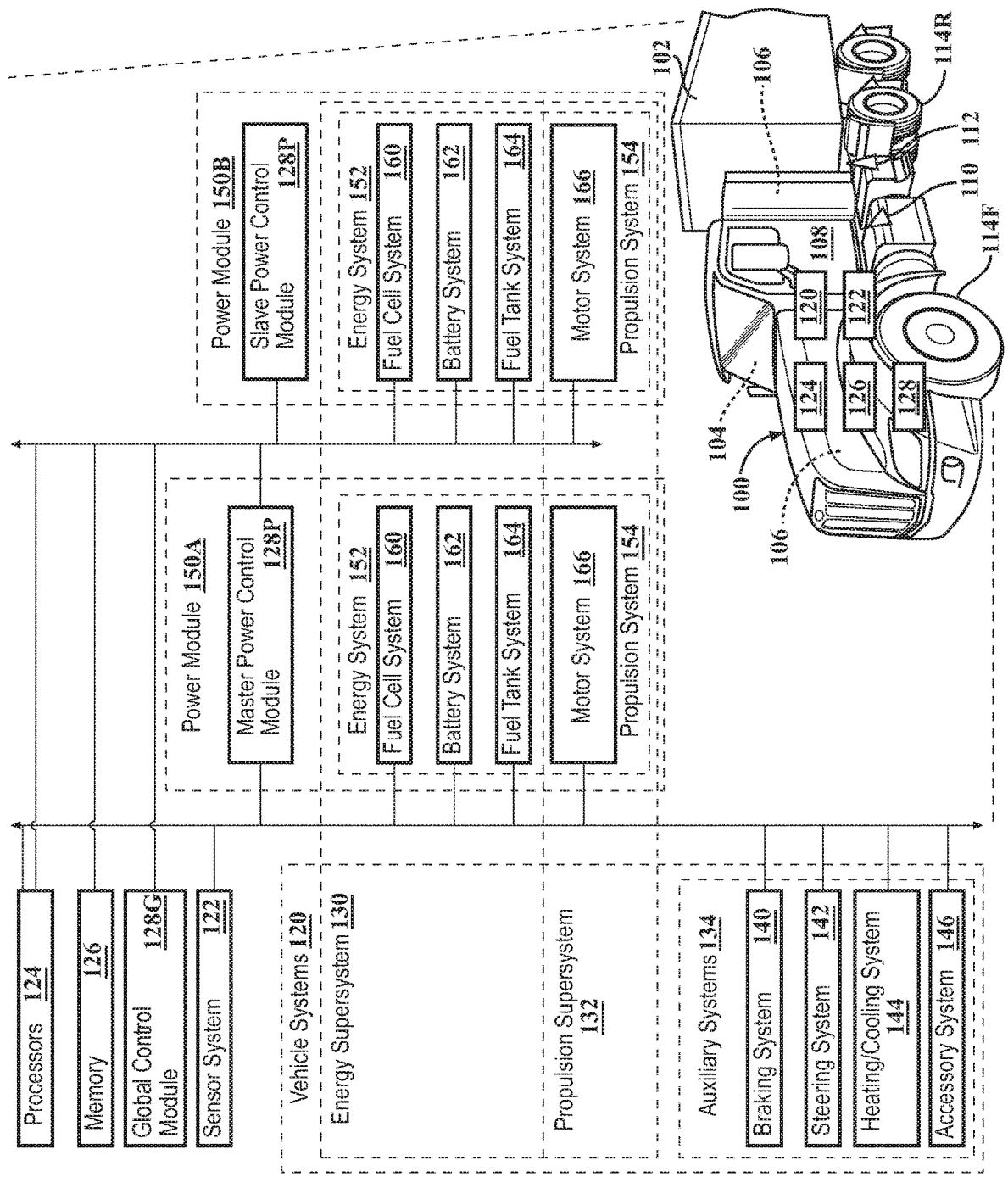
FIG. 1 is a portrayal of a fuel cell vehicle (FCV) using a perspective view and block diagrams, showing vehicle systems, including an energy supersystem, a propulsion supersystem and auxiliary systems, a sensor system, control modules, including a global control module and power control modules, and multiple power modules, including an energy system and a propulsion system per power module, a fuel cell system, a battery system and a fuel tank system per energy system, and a motor system per propulsion system.

A fuel cell vehicle (FCV) 100 is shown in FIG. 1 as a representative electrified vehicle. Although the FCV 100 is a fuel cell vehicle, it will be understood that this disclosure is largely applicable in principle to other electrified vehicles. In this description, uses of "front," "forward" and the like, and uses of "rear," "rearward" and the like, refer to the longitudinal directions of the FCV 100. "Front," "forward" and the like refer to the front (fore) of the FCV 100, while "rear," "rearward" and the like refer to the back (aft) of the FCV 100. Uses of "side," "sideways," "transverse" and the like refer to the lateral directions of the FCV 100, with "driver's side" and the like referring to the left side of the FCV 100, and "passenger side" and the like referring to the right side of the FCV 100.

The FCV 100 is a semi-tractor or, in other words, a tractor unit that, together with a hitched semitrailer 102, forms a semi-truck. The FCV 100 has an exterior and a number of interior compartments. The compartments include a passenger compartment 104 and one or more engine compartments 106. The FCV 100 may include, among other things, seats and a dash assembly housed in its passenger compartment 104.

The FCV 100 has a body 108 that forms its exterior and defines its compartments. The body 108 has upright sides, a floor, a front end, a rear end, a roof and the like. In the semi-truck to which the FCV 100 belongs, the semitrailer 102 similarly has an exterior and, as an interior compartment, a cargo compartment for carrying cargo. In addition to the body 108, the FCV 100 has a chassis 110. The chassis 110 serves as an underbody for the FCV 100. The chassis 110, like the body 108, forms the exterior of the FCV 100. As part of the chassis 110, the FCV 100 includes a hitch 112 for hitching the semitrailer 102 to the FCV 100. With the semitrailer 102 hitched to the FCV 100, the FCV 100 is operable to pull the semitrailer 102 and any onboard cargo.

The FCV 100 has a drivetrain. The drivetrain is part of, mounted to or otherwise supported by the chassis 110. The drivetrain may be housed, in whole or in part, in any combination of the passenger compartment 104, the engine compartments 106 or elsewhere in the FCV 100. As part of the drivetrain, the FCV 100 includes wheels 114. The wheels 114 support the remainder of the FCV 100 on the ground. The FCV 100 includes ten wheels 114, two of which are front wheels 114F, and eight of which are rear wheels 114R. The rear wheels 114R are arranged in four dual-wheel setups. The rear wheels 114R belonging to two driver's side dual-wheel setups are shown, with the other two, passenger side dual-wheel setups being mirror images that include the remaining rear wheels 114R. One, some or all of the wheels 114 are powered to drive the FCV 100 along the ground. In a rear-wheel drive arrangement, one, some or all of the rear wheels 114R are powered to drive the FCV 100 along the ground. For this purpose, also as part of the drivetrain, in addition to the wheels 114, the FCV 100 includes any penultimate combination of a transmission, a differential, a drive shaft and the like, to which the wheels 114 are mechanically connected.

The FCV 100 operates as an assembly of interconnected items that equip the FCV 100 to satisfy real-time vehicle demands. Generally speaking, a vehicle demand corresponds to a vehicle function whose performance satisfies the vehicle demand. Accordingly, the FCV 100 is equipped, in operation, to satisfy one or more vehicle demands by performing one or more corresponding vehicle functions. With respect to performing vehicle functions, the FCV 100 is subject to any combination of manual operation and autonomous operation. In the case of manual operation, the FCV 100 may be manual-only. In the case of autonomous operation, the FCV 100 may be semi-autonomous, highly-autonomous or fully-autonomous.

For purposes of satisfying vehicle demands, the FCV 100 includes one or more vehicle systems 120. Either alone or in conjunction with the drivetrain, the vehicle systems 120 are operable to perform vehicle functions on behalf of the FCV 100, and thereby satisfy corresponding vehicle demands on behalf of the FCV 100. Any combination of the vehicle systems 120 may be operable to perform a vehicle function. Accordingly, from the perspective of a vehicle function, as well as a corresponding vehicle demand, one, some or all of the vehicle systems 120 serve as associated vehicle systems 120. Moreover, each vehicle system 120 may be operable to perform any combination of vehicle functions, and thereby satisfy any combination of corresponding vehicle demands, in whole or in part. Accordingly, each vehicle system 120, from its own perspective, serves as an associated vehicle system 120 for one or more vehicle functions, as well as one or more corresponding vehicle demands.

In addition to the vehicle systems 120, the FCV 100 includes a sensor system 122, as well as one or more processors 124, memory 126, and one or more control modules 128 to which the vehicle systems 120 and the sensor system 122 are communicatively connected. The sensor system 122 is operable to detect information about the FCV 100. The processors 124, the memory 126 and the control modules 128 together serve as one or more computing devices whose control modules 128 are employable to orchestrate the operation of the FCV 100.

Specifically, the control modules 128 operate the vehicle systems 120 based on information about the FCV 100. Accordingly, as a prerequisite to operating the vehicle systems 120, the control modules 128 gather information about the FCV 100, including any combination of the information about the FCV 100 detected by the sensor system 122 and information about the FCV 100 communicated between the control modules 128. The control modules 128 then evaluate the information about the FCV 100, and operate the vehicle systems 120 based on their evaluation.

As part of their evaluation of the information about the FCV 100, the control modules 128 identify one or more vehicle demands. Relatedly, as part of their operation of the vehicle systems 120, when a vehicle demand is identified, the control modules 128 operate one or more associated vehicle systems 120 to satisfy the vehicle demand.

Vehicle Systems.

The vehicle systems 120 are part of, mounted to or otherwise supported by the chassis 110. The vehicle systems 120 may be housed, in whole or in part, in any combination of the passenger compartment 104, the engine compartments 106 or elsewhere in the FCV 100. Each vehicle system 120 includes one or more vehicle elements. On behalf of the vehicle system 120 to which it belongs, each vehicle element is operable to perform, in whole or in part, any combination of vehicle functions with which the vehicle system 120 is associated. It will be understood that the vehicle elements, as well as the vehicle systems 120 to which they belong, may but need not be mutually distinct.

The vehicle systems 120 include an energy supersystem 130 and a propulsion supersystem 132. The energy supersystem 130 and the propulsion supersystem 132 are electrically connected to one another. Moreover, the drivetrain is mechanically connected to the propulsion supersystem 132. The propulsion supersystem 132 and the drivetrain together serve as an electrified powertrain for the FCV 100. The energy supersystem 130 is operable to perform one or more energy functions, including but not limited to generating electrical energy. The propulsion supersystem 132 is operable to perform one or more propulsion functions using electrical energy from the energy supersystem 130, including but not limited to powering the wheels 114.

Specifically, the energy supersystem 130 is operable to generate electrical energy, store electrical energy, condition and otherwise handle electrical energy, and store and otherwise handle fuel. In conjunction with the drivetrain, the propulsion supersystem 132 is operable to power the wheels 114 using electrical energy from the energy supersystem 130. With the wheels 114 powered, the propulsion supersystem 132 is employable to accelerate the FCV 100, maintain the speed of the FCV 100 (e.g., on level or uphill ground) and otherwise drive the FCV 100 along the ground. The propulsion supersystem 132 is also operable to generate electrical energy using one, some or all of the wheels 114, and consequently retard the wheels 114. With the wheels 114 retarded, the propulsion supersystem 132 is employable to decelerate the FCV 100, maintain the speed of the FCV 100 (e.g., on downhill ground) and otherwise drive the FCV 100 along the ground. The energy supersystem 130, in turn, is operable to store electrical energy from the propulsion supersystem 132. As the combined product of generating electrical energy, and consequently retarding the wheels 114, and storing electrical energy, the propulsion supersystem 132 and the energy supersystem 130 are operable to regeneratively brake the FCV 100 at the wheels 114.

In addition to the energy supersystem 130 and the propulsion supersystem 132, the vehicle systems 120 include one or more auxiliary systems 134. The auxiliary systems 134 include a braking system 140, a steering system 142, a heating/cooling system 144 and an accessory system 146. The auxiliary systems 134, like the propulsion supersystem 132, are electrically connected to the energy supersystem 130. The auxiliary systems 134 are operable to perform one or more auxiliary functions using electrical energy from the energy supersystem 130, including but not limited to frictionally braking the FCV 100, steering the FCV 100, cooling the FCV 100, heating the FCV 100 and one or more accessory functions. Accordingly, although the propulsion supersystem 132 acts as the principal electrical load on the energy supersystem 130, the auxiliary systems 134 act as electrical loads on the energy supersystem 130 as well.

Sensor System.

As part of the sensor system 122, the FCV 100 includes one or more onboard sensors. The sensors monitor the FCV 100 in real-time. The sensors, on behalf of the sensor system 122, are operable to detect information about the FCV 100, including information about user requests and information about the operation of the FCV 100.

The FCV 100 includes user controls. The user controls serve as interfaces between users of the FCV 100 and the FCV 100 itself, and are operable to receive mechanical, verbal and other user inputs requesting vehicle functions. In conjunction with corresponding user controls, and among the sensors, the FCV 100 includes an accelerator pedal sensor, a brake pedal sensor, a steering angle sensor and the like, and one or more selector sensors, one or more microphones, one or more cameras and the like. Relatedly, among information about user requests, the sensor system 122 is operable to detect user inputs requesting powering the wheels 114, user inputs requesting braking, steering and the like, user inputs requesting heating, cooling and the like, as well as user inputs requesting accessory functions.

Also among the sensors, the FCV 100 includes one or more speedometers, one or more gyroscopes, one or more accelerometers, one or more wheel sensors, one or more thermometers, one or more inertial measurement units (IMUs), one or more controller area network (CAN) sensors and the like. Relatedly, among information about the operation of the FCV 100, the sensor system 122 is operable to detect the location and motion of the FCV 100, including its speed, acceleration, orientation, rotation, direction and the like, the movement of the wheels 114, temperatures of the FCV 100, and the operational statuses of one, some or all of the vehicle systems 120.

Control Modules.

As noted above, the processors 124, the memory 126 and the control modules 128 together serve as one or more computing devices whose control modules 128 orchestrate the operation of the FCV 100. The control modules 128 include a global control module 128G. Relatedly, as part of a central control system, the FCV 100 includes a global control unit (GCU) to which the global control module 128G belongs. Although the FCV 100, as shown, includes one global control module 128G, it will be understood that this disclosure is applicable in principle to otherwise similar vehicles including multiple global control modules 128G. The control modules 128 also include one or more power control modules 128P. Relatedly, the FCV 100 includes one or more power control units (PCUs) to which the power control modules 128P belong. Although the processors 124 and the memory 126 are shown as being common to the GCU and the PCUs, it is contemplated that one, some or all of the GCU and the PCUs could be a standalone computing device with one or more dedicated processors 124 and dedicated memory 126.

The global control module 128G orchestrates the global operation of the FCV 100, including but not limited to the operation of the vehicle systems 120, on behalf of the GCU. The power control modules 128P orchestrate the operation of the energy supersystem 130 and the propulsion supersystem 132, as well as certain auxiliary systems 146, on behalf of the PCUs.

The processors 124 may be any components configured to execute any of the processes described herein or any form of instructions to carry out such processes or cause such processes to be performed. The processors 124 may be implemented with one or more general purpose or special purpose processors. Examples of suitable processors 124 include microprocessors, microcontrollers, digital signal processors or other forms of circuitry that execute software. Other examples of suitable processors 124 include without limitation central processing units (CPUs), array processors, vector processors, digital signal processors (DSPs), field programmable gate arrays (FPGAs), programmable logic arrays (PLAs), application specific integrated circuits (ASICs), programmable logic circuitry or controllers. The processors 124 may include at least one hardware circuit (e.g., an integrated circuit) configured to carry out instructions contained in program code. In arrangements where there are multiple processors 124, the processors 124 may work independently from each other or in combination with one another.

The memory 126 is a non-transitory computer readable medium. The memory 126 may include volatile or nonvolatile memory, or both. Examples of suitable memory 126 includes random access memory (RAM), flash memory, read only memory (ROM), programmable read only memory (PROM), erasable programmable read only memory (EPROM), electrically erasable programmable read only memory (EEPROM), registers, magnetic disks, optical disks, hard drives or any other suitable storage medium, or any combination of these. The memory 126 includes stored instructions in program code. Such instructions are executable by the processors 124 or the control modules 128. The memory 126 may be part of the processors 124 or the control modules 128, or may be communicatively connected the processors 124 or the control modules 128.

Generally speaking, the control modules 128 include instructions that may be executed by the processors 124. The control modules 128 may be implemented as computer readable program code that, when executed by the processors 124, execute one or more of the processes described herein. Such computer readable program code may be stored on the memory 126. The control modules 128 may be part of the processors 124, or may be communicatively connected the processors 124.

Power Modules

As noted above, the vehicle systems 120 are operable to perform vehicle functions on behalf of the FCV 100, and thereby satisfy corresponding vehicle demands on behalf of the FCV 100. Specifically, the energy supersystem 130 is operable to perform energy functions, and thereby satisfy corresponding energy demands, the propulsion supersystem 132 is operable to perform propulsion functions, and thereby satisfy corresponding propulsion demands, and the auxiliary systems 134 are operable to perform auxiliary functions, and thereby satisfy corresponding auxiliary demands.

From the perspective of the global control module 128G and the power control modules 128P, and the orchestration of the global operation of the FCV 100, the vehicle demands include one or more global vehicle demands or, in other words, vehicle demands common to the FCV 100. Specifically, one or more of the energy demands are global energy demands, and one or more of the propulsion demands are global propulsion demands. The global energy demands may include any combination of one or more demands to generate electrical energy, one or more demands to store electrical energy, and one or more demands to store and otherwise handle fuel. The global propulsion demands may include one or more demands to power the wheels 114 and one or more demands to retard the wheels 114. Any combination of the global energy demands and the global propulsion demands may be part of global combined energy and propulsion demands, such as one or more demands to regeneratively brake the FCV 100. Moreover, each auxiliary demand is a global auxiliary demand. The global auxiliary demands may include any combination of one or more demands to frictionally brake the FCV 100, one or more demands to steer the FCV 100, one or more demands to cool the FCV 100, one or more demands to heat the FCV 100 and one or more demands to perform accessory functions.

Beyond being equipped to satisfy the global vehicle demands by performing corresponding vehicle functions, the FCV 100 is equipped to satisfy one or more vehicle demand requirements. Specifically, in relation to being operable to perform vehicle functions, and thereby satisfy corresponding global vehicle demands, the vehicle systems 120 have the capacity to satisfy vehicle demand requirements on behalf of the FCV 100. Accordingly, the energy supersystem 130 has the capacity to satisfy certain energy demand requirements, the propulsion supersystem 132 has the capacity to satisfy certain propulsion demand requirements, and the auxiliary systems 134 have the capacity to satisfy certain auxiliary demand requirements.

Generally speaking, vehicle demand requirements are specific to particular vehicle applications. For example, the FCV 100, as a semi-tractor application, has higher energy demand requirements and higher propulsion demand requirements than many other vehicle applications. In some cases, the FCV 100 could have multiple times the energy demand requirements and multiple times the propulsion demand requirements of other vehicle applications.

For purposes of realizing the capacity to satisfy the energy demand requirements and the capacity to satisfy the propulsion demand requirements, the FCV 100 includes multiple counterpart power modules 150A-B (referenced generally using "power module 150" or "power modules 150") whose vehicle elements are interconnected on an element-to-element, inter-power-module basis. Although the FCV 100, as shown, includes two power modules 150, it will be understood that this disclosure is applicable in principle to otherwise similar vehicles including more than two power modules 150. In relation to the power modules 150, the energy supersystem 130 includes multiple counterpart energy systems 152, and the propulsion supersystem 132 includes multiple counterpart propulsion systems 154. And, in the FCV 100, the energy supersystem 130 and the propulsion supersystem 132 are arranged across the power modules 150, with each power module 150 including an energy system 152 and a propulsion system 154.

In each power module 150, the propulsion system 154 and the energy system 152 are electrically connected to one another. Moreover, the drivetrain is mechanically connected to each propulsion system 154. On behalf of the power module 150 to which it belongs, each energy system 152 is operable to perform energy functions with which the energy supersystem 130 is associated, including but not limited to generating electrical energy. Similarly, on behalf of the power module 150 to which it belongs, each propulsion system 154 is operable to perform propulsion functions with which the propulsion supersystem 132 is associated using electrical energy, including but not limited to powering the wheels 114. Each propulsion system 154 is, specifically, operable to perform propulsion functions using electrical energy from the energy system 152 of the power module 150 to which it and the energy system 152 belong.

Each energy system 152, and the power module 150 to which it belongs, includes a fuel cell system 160, a battery system 162 and a fuel tank system 164. Each propulsion system 154, and the power module 150 to which it belongs, includes a motor system 166. Inside each power module 150, the motor system 166 is electrically connected to the fuel cell system 160. Moreover, the battery system 162 and the fuel cell system 160 are electrically connected to one another, and the motor system 166 and the battery system 162 are electrically connected to one another. Moreover, the fuel cell system 160 is fluidly connected to the fuel tank system 164. The fuel cell system 160 is operable to generate electrical energy using electrical energy from the battery system 162 and fuel from the fuel tank system 164. In conjunction with the drivetrain, the motor system 166 is operable to power the wheels 114 using electrical energy from any combination of the fuel cell system 160 and the battery system 162. The motor system 166 is also operable to generate electrical energy using the wheels 114, and consequently retard the wheels 114. The battery system 162 is operable to store electrical energy from the fuel cell system 160. The battery system 162 is also operable to store electrical energy from the motor system 166. The fuel tank system 164 is operable to store and otherwise handle fuel, including fueling the fuel cell system 160 with fuel.

The power modules 150 are "stacked" for purposes of realizing the capacity to satisfy the energy demand requirements and the capacity to satisfy the propulsion demand requirements of the FCV 100 to which they belong. Specifically, given an energy demand requirement, in each power module 150, the energy system 152 has the capacity to satisfy a share of the energy demand requirement. With the energy systems 152 each having the capacity to satisfy a share of the energy demand requirement, the power modules 150 to which the energy systems 152 belong have the capacity to contributorily satisfy the energy demand requirement. With the energy systems 152 likewise belonging to the energy supersystem 130, the energy supersystem 130 has the capacity to satisfy the energy demand requirement as well. Similarly, given a propulsion demand requirement, in each power module 150, the propulsion system 154 has the capacity to satisfy a share of the propulsion demand requirement. With the propulsion systems 154 each having the capacity to satisfy a share of the propulsion demand requirement, the power modules 150 to which the propulsion systems 154 belong have the capacity to contributorily satisfy the propulsion demand requirement. With the propulsion systems 154 likewise belonging to the propulsion supersystem 132, the propulsion supersystem 132 has the capacity to satisfy the propulsion demand requirement as well.

Given a global energy demand, in each power module 150, the energy system 152 is operable to satisfy a share of the global energy demand. With the energy systems 152 each operable to satisfy a share of the global energy demand, the power modules 150 to which the energy systems 152 belong are operable to contributorily satisfy the global energy demand. With the energy systems 152 likewise belonging to the energy supersystem 130, the energy supersystem 130 is operable to satisfy the global energy demand as well. Similarly, given a global propulsion demand, in each power module 150, the propulsion system 154 is operable to satisfy a share of the global propulsion demand. With the propulsion systems 154 each operable to satisfy a share of the global propulsion demand, the power modules 150 to which the propulsion systems 154 belong are operable to contributorily satisfy the global propulsion demand. With the propulsion systems 154 likewise belonging to the propulsion supersystem 132, the propulsion supersystem 132 is operable to satisfy the global propulsion demand as well.

Although vehicle demand requirements are specific to particular vehicle applications, some vehicle demand requirements are less application-dependent than others. The FCV 100, for instance, even as a semi-tractor application, still has similar auxiliary demand requirements as many other vehicle applications.

In the FCV 100, the auxiliary systems 134, rather than having multiple counterpart relationships, are common to the FCV 100. In relation to the power modules 150 and the energy supersystem 130, one or more of the auxiliary elements, either individually or as part of the auxiliary systems 134 to which they belong, are assigned to the power modules 150. At each power module 150, each assigned auxiliary element, either individually or as part of the auxiliary system 134 to which it belongs, as the case may be, is electrically connected to the energy system 152. On behalf of the FCV 100 and the auxiliary system 134 to which it belongs, each assigned auxiliary element is operable to perform auxiliary functions using electrical energy from the energy system 152. Accordingly, in each power module 150, although the propulsion system 154 acts as the principal electrical load on the energy system 152, the assigned auxiliary elements act as electrical loads on the energy system 152 as well. However, given a global auxiliary demand, the assigned auxiliary elements are operable to contributorily satisfy the global auxiliary demand on an unassigned basis.

As noted above, the power control modules 128P orchestrate the operation of the energy supersystem 130 and the propulsion supersystem 132, as well as certain auxiliary systems 146. Specifically, in relation to the arrangement of the energy supersystem 130 and the propulsion supersystem 132 across the power modules 150, the FCV 100 includes multiple counterpart power control modules 128P. And, in the FCV 100, each power control module 128P is assigned a power module 150. With each power module 150 including an energy system 152 and a propulsion system 154, each power control module 128P is assigned an energy system 152 and a propulsion system 154. Moreover, each power control module 128P is assigned auxiliary elements. Specifically, each power control module 128P is assigned the auxiliary elements assigned to the power module 150 that, in turn, is assigned to the power control module 128P. Each power control module 128P orchestrates the operation of the assigned power module 150, including the operation of the assigned energy system 152 and the operation of the assigned propulsion system 154, as well as the operation of the assigned auxiliary elements.

In a modularized implementation, each power module 150 is sourced from another vehicle application, such as a passenger car application, with lower energy demand requirements and lower propulsion demand requirements than the FCV 100. Specifically, each power module 150 is a modularized version of a complete energy system and a complete propulsion system from the other vehicle application. Relatedly, each power control module 128P is sourced from the other vehicle application as well. Specifically, each power control module 128P belongs to a PCU sourced from the other vehicle application as a standalone computing device with one or more dedicated processors and dedicated memory, in addition to the power control module 128P itself.

Among other things, it follows that the FCV 100, as a semi-tractor application with higher energy demand requirements and higher propulsion demand requirements than the other vehicle application, is not the product of traditional design principles. Specifically, given the other vehicle application, instead of stacking the power modules 150 to realize the capacity to satisfy the energy demand requirements and the capacity to satisfy the propulsion demand requirements of the FCV 100, traditional design principles would call for scaling the energy system and scaling the propulsion system from the other vehicle application. Moreover, traditional design principles would call for sourcing the PCU from the other vehicle application to orchestrate the operation of the scaled energy system and the scaled propulsion system, as well as the auxiliary systems 134 on an unassigned basis, by itself.

Any combination of the fuel cell system 160, the battery system 162 and the fuel tank system 164 of one power module 150 could have the same capacity to satisfy energy demand requirements as their counterparts of the remaining power module 150. Additionally, or alternatively, the motor system 166 of one power module 150 could have the same capacity to satisfy propulsion demand requirements as its counterpart of the remaining power module 150.

Beyond the FCV 100, across a broader vehicle lineup, for new vehicle applications, multiple of the same or similar power modules 150 could be stacked for purposes of realizing the capacity to satisfy the energy demand requirements and the capacity to satisfy the propulsion demand requirements of the new vehicle applications. One or more vehicle elements of the power modules 150 could be standardized across the vehicle lineup. For instance, in every power module 150, the fuel cell system 160 could be the same. Additionally, or alternatively, one or more of the power control modules 128P could be the same. With the standardized vehicle elements having the same capacity to satisfy vehicle demand requirements regardless of the vehicle demand requirements of the new applications, only singular, single-capacity standardized vehicle elements have to be developed and produced. Relatedly, beyond the standardized vehicle elements, the remainder of the power modules 150 could be optimized for new vehicle applications. For instance, when, in every power module 150, the fuel cell system 160 is the same, the battery systems 162 of the power modules 150 could be optimized to have the capacity to contributorily satisfy the energy demand requirements of new applications. Additionally, or alternatively, the motor systems 166 of the power modules 150 could be optimized to have the capacity to contributorily satisfy the propulsion demand requirements of new applications.

Since they are easily integrated into new vehicle applications, the power modules 150 are useful beyond initial vehicle development and production. For instance, in an end-of-life (EOL) scenario for the FCV 100, a power module 150 may no longer have the capacity to contributorily satisfy the energy demand requirements of the FCV 100. Additionally, or alternatively, the power module 150 may no longer have the capacity to contributorily satisfy the propulsion demand requirements of the FCV 100. The power module 150 may nonetheless have the capacity to contributorily satisfy the energy demand requirements and the capacity to contributorily satisfy the propulsion demand requirements of another vehicle application. Accordingly, instead of disposing of the power module 150, it could be integrated into the other vehicle application.

Energy System and Propulsion System.

Figure 2A:
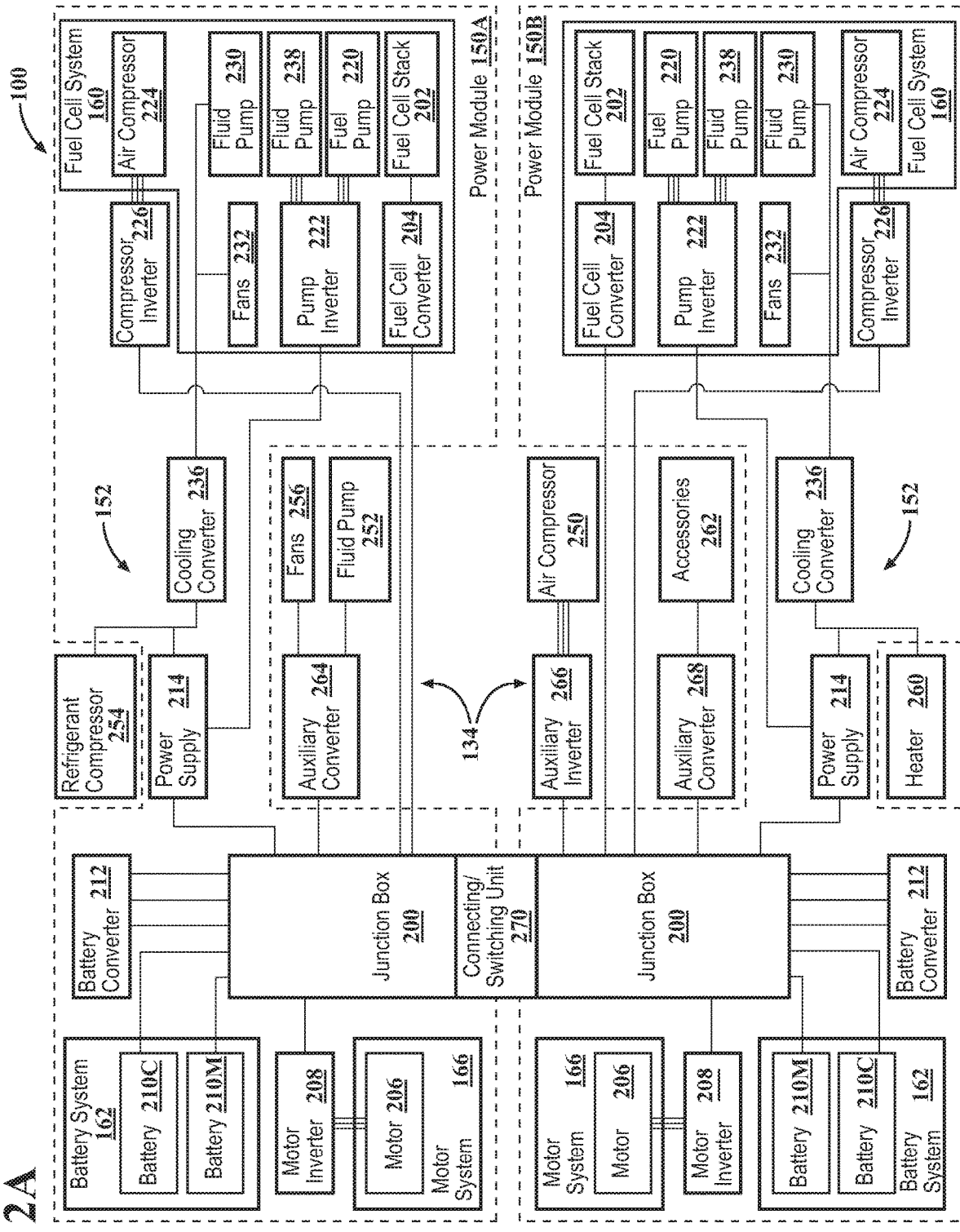
FIG. 2A is a partial portrayal of the FCV using block diagrams, further showing the power modules, including a fuel cell stack per fuel cell system, multiple batteries per battery system, and a motor per motor system, as well as an assignment of auxiliary elements of the auxiliary systems to the power modules.
Figure 2B:
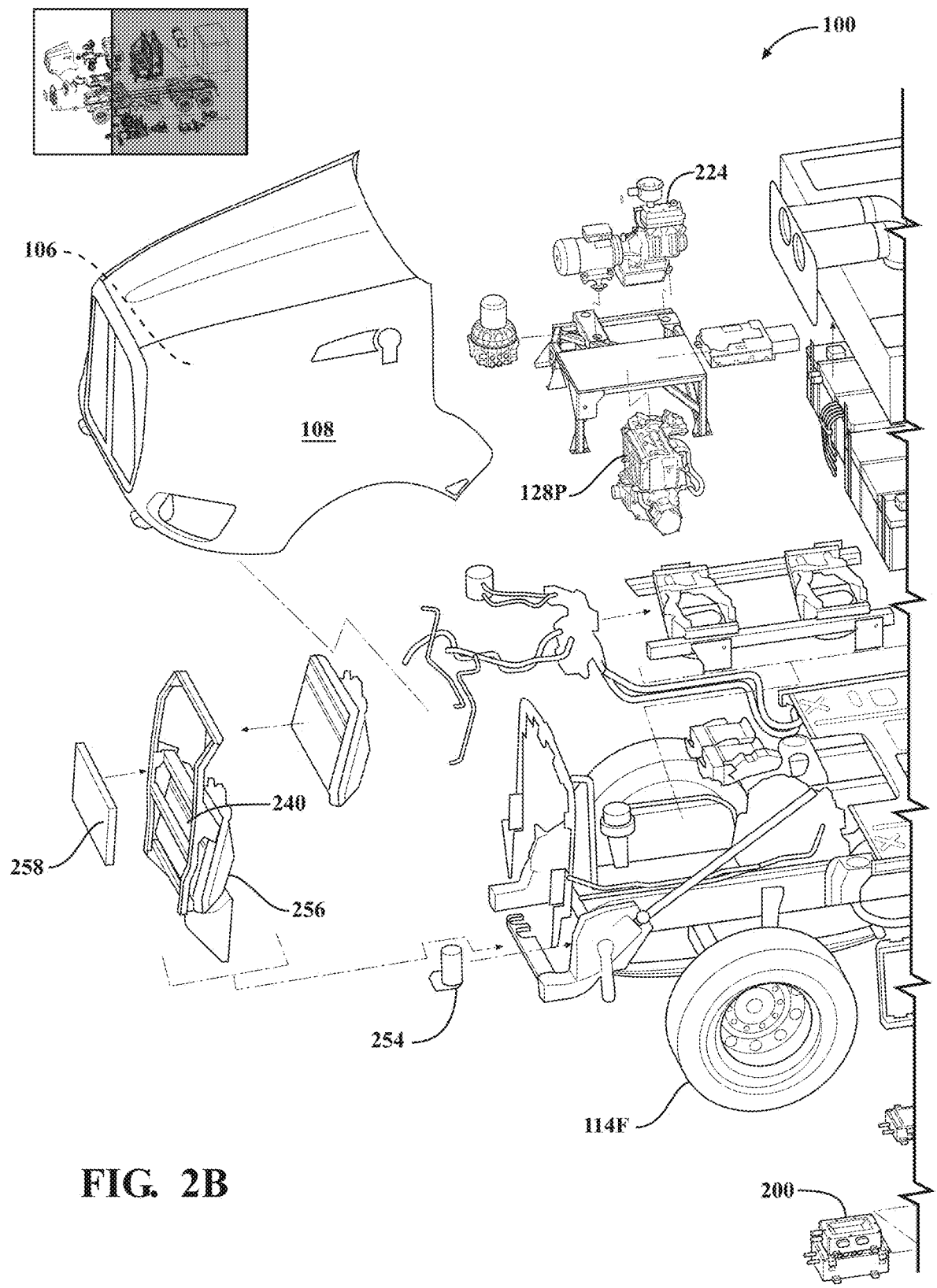
FIG. 2B is a portrayal of the FCV using a perspective exploded view, further showing the vehicle systems and elements of the vehicle systems.

As noted above, each power module 150 includes an energy system 152 and a propulsion system 154. As shown with additional reference to FIGS. 2A and 2B, in addition to the fuel cell system 160, the battery system 162 and the fuel tank system 164, each energy system 152, and the power module 150 to which the energy system 152 belongs, includes a junction box 200 and attendant energy elements. Inside each power module 150, the motor system 166 is electrically connected to the fuel cell system 160 through the junction box 200. Moreover, the battery system 162 and the fuel cell system 160 are electrically connected to one another through the junction box 200, and the motor system 166 and the battery system 162 are electrically connected to one another through the junction box 200.

The FCV 100 includes one or more energy elements as part of the fuel cell system 160. Among the energy elements of the fuel cell system 160, the FCV 100 includes a fuel cell stack 202. Although the FCV 100, as shown, includes one fuel cell stack 202 per fuel cell system 160, it will be understood that this disclosure is applicable in principle to otherwise similar vehicles including multiple fuel cell stacks 202 per fuel cell system 160. In relation to the fuel cell stack 202, among the attendant energy elements of the energy system 152, the FCV 100 includes a fuel cell converter 204. The fuel cell converter 204 is electrically connected to the fuel cell stack 202. The fuel cell stack 202 is operable to generate electrical energy. The fuel cell converter 204 is operable to condition electrical energy from the fuel cell stack 202. Specifically, the fuel cell converter 204 is a DC/DC converter operable to convert lower voltage DC electrical energy from the fuel cell stack 202 into higher voltage DC electrical energy. For instance, the lower voltage DC electrical energy may be medium voltage DC electrical energy, and the higher voltage DC electrical energy may be high voltage DC electrical energy.

The FCV 100 also includes one or more propulsion elements as part of the motor system 166. Among the propulsion elements of the motor system 166, the FCV 100 includes a motor 206. Although the FCV 100, as shown, includes one motor 206 per motor system 166, it will be understood that this disclosure is applicable in principle to otherwise similar vehicles including multiple motors 206 per motor system 166. The motor 206 is a synchronous three-phase AC electric motor. In relation to the motor 206, among the attendant energy elements of the energy system 152, the FCV 100 includes a motor inverter 208. The motor inverter 208 is electrically connected to the fuel cell converter 204 through the junction box 200, and the motor 206 is electrically connected to the motor inverter 208. Moreover, the drivetrain is mechanically connected to the motor 206. The motor inverter 208 is operable to condition electrical energy from the fuel cell converter 204. Specifically, the motor inverter 208 is operable to convert DC electrical energy from the fuel cell converter 204 into three-phase AC electrical energy. For instance, the three-phase AC electrical energy may be high voltage AC electrical energy. In conjunction with the drivetrain, the motor 206 is operable to power the wheels 114 using electrical energy from the motor inverter 208.

The FCV 100 also includes one or more energy elements as part of the battery system 162. Among the energy elements of the battery system 162, the FCV 100 includes one or more batteries 210. Although the FCV 100, as shown, includes two batteries 210 per battery system 162, it will be understood that this disclosure is applicable in principle to otherwise similar vehicles including one battery 210 per battery system 162, as well as otherwise similar vehicles otherwise including multiple batteries 210 per battery system 162. In relation to the batteries 210, among the attendant energy elements of the energy system 152, the FCV 100 includes a battery converter 212. From the perspective of the fuel cell system 160, the battery converter 212 is electrically connected to the fuel cell converter 204 through the junction box 200, and the batteries 210 are electrically connected to the battery converter 212 through the junction box 200. The battery converter 212 is operable to condition electrical energy from the fuel cell converter 204. Specifically, the battery converter 212 is a DC/DC converter operable to convert higher voltage DC electrical energy from the fuel cell converter 204 into lower voltage DC electrical energy. For instance, the higher voltage DC electrical energy may be high voltage DC electrical energy, and the lower voltage DC electrical energy may be medium voltage DC electrical energy. The batteries 210 are operable to store electrical energy from the battery converter 212.

Also, from the perspective of the battery system 162, the battery converter 212 is electrically connected to the batteries 210 through the junction box 200, the motor inverter 208 is electrically connected to the battery converter 212 through the junction box 200 and, as noted above, the motor 206 is electrically connected to the motor inverter 208. Relatedly, the battery converter 212 is also operable to condition electrical energy from the batteries 210. Specifically, the battery converter 212 is a DC/DC converter operable to convert lower voltage DC electrical energy from the batteries 210 into higher voltage DC electrical energy. For instance, the lower voltage DC electrical energy may be medium voltage DC electrical energy, and the higher voltage DC electrical energy may be high voltage DC electrical energy. The motor inverter 208 is also operable to condition electrical energy from the battery converter 212. Specifically, the motor inverter 208 is operable to convert DC electrical energy from the battery converter 212 into three-phase AC electrical energy. As noted above, the three-phase AC electrical energy may be high voltage AC electrical energy. Once again, in conjunction with the drivetrain, the motor 206 is operable to power the wheels 114 using electrical energy from the motor inverter 208.

Similarly, from the perspective of the motor system 166, the motor inverter 208 is electrically connected to the motor 206, the battery converter 212 is electrically connected to the motor inverter 208 through the junction box 200 and, as noted above, the batteries 210 are electrically connected to the battery converter 212 through the junction box 200. Relatedly, in conjunction with the drivetrain, the motor 206 is also operable to generate electrical energy using the wheels 114, and consequently retard the wheels 114. Moreover, the motor inverter 208 is also operable to condition electrical energy from the motor 206. Specifically, the motor inverter 208 is operable to convert three-phase AC electrical energy from the motor 206 into DC electrical energy. For instance, the three-phase AC electrical energy may be high voltage AC electrical energy, and the DC electrical energy may be high voltage DC electrical energy. The battery converter 212 is also operable to condition electrical energy from the motor inverter 208 in the same manner as electrical energy from the fuel cell converter 204. Once again, the batteries 210 are operable to store electrical energy from the battery converter 212. As the combined product of generating electrical energy, consequently retarding the wheels 114 and storing electrical energy, the motor 206 and the batteries 210 are operable to regeneratively brake the FCV 100 at the wheels 114.

Among other things, it follows that the motor 206 is operable to power the wheels 114 using electrical energy from any combination of the fuel cell stack 202 and the batteries 210. Moreover, the batteries 210 are operable to store electrical energy from the fuel cell stack 202. In a fuel-cell-powered implementation, the motor 206 principally powers the wheels 114 using electrical energy from the fuel cell stack 202. In cases of shortages, the motor 206 powers the wheels 114 using a combination of electrical energy from the fuel cell stack 202 and supplementary electrical energy from the batteries 210. On the other hand, in cases of surpluses, the motor 206 powers the wheels 114 using some electrical energy from the fuel cell stack 202, and the batteries 210 store the remaining electrical energy from the fuel cell stack 202.

Also among the attendant energy elements of the energy system 152, the FCV 100 includes a power supply 214. The power supply 214 is electrically connected to the batteries 210 through the junction box 200. The power supply 214 is operable to distribute electrical energy from the batteries 210. Specifically, the power supply 214 is a DC power supply operable to distribute DC electrical energy from the batteries 210. For instance, the DC electrical energy may be medium voltage DC electrical energy.

As noted above, the FCV 100 includes the fuel cell stack 202 among the energy elements of the fuel cell system 160. Also among the energy elements of the fuel cell system 160, the FCV 100 includes a fuel pump 220. The fuel pump 220 is a three-phase AC fuel pump. In relation to the fuel pump 220, among the energy elements of the fuel cell system 160, the FCV 100 includes a pump inverter 222. The pump inverter 222 is electrically connected to the power supply 214, and the fuel pump 220 is electrically connected to the pump inverter 222. Moreover, the fuel pump 220 is fluidly connected to the fuel tank system 164, and the fuel cell stack 202 is fluidly connected to the fuel pump 220. The pump inverter 222 is operable to condition electrical energy from the power supply 214. Specifically, the pump inverter 222 is operable to convert DC electrical energy from the power supply 214 into three-phase AC electrical energy. For instance, the three-phase AC electrical energy may be medium voltage AC electrical energy. The fuel pump 220 is operable to pump fuel from the fuel tank system 164 into the fuel cell stack 202 using electrical energy from the pump inverter 222.

Also among the energy elements of the fuel cell system 160, the FCV 100 includes an air compressor 224. The air compressor 224 is a three-phase AC air compressor. In relation to the air compressor 224, among the attendant energy elements of the energy system 152, the FCV 100 includes a compressor inverter 226. The compressor inverter 226 is electrically connected to the battery converter 212 through the junction box 200, and the air compressor 224 is electrically connected to the compressor inverter 226. Moreover, in addition to being fluidly connected to the fuel pump 220, the fuel cell stack 202 is pneumatically connected to the air compressor 224. The compressor inverter 226 is operable to condition electrical energy from the battery converter 212. Specifically, the compressor inverter 226 is operable to convert DC electrical energy from the battery converter 212 into three-phase AC electrical energy. For instance, with the DC electrical energy being high voltage DC electrical energy, the three-phase AC electrical energy may be high voltage AC electrical energy. The air compressor 224 is operable to pump air into the fuel cell stack 202 using electrical energy from the compressor inverter 226.

The fuel cell stack 202 includes one or more fuel cells. The fuel cell stack 202 is operable to employ the fuel cells to execute a chemical reaction that combines fuel from the fuel pump 220 with oxygen in air from the air compressor 224, and generates electrical energy. Accordingly, as the combined product of pumping fuel into the fuel cell stack 202, pumping air into the fuel cell stack 202 and executing the chemical reaction, the fuel pump 220, the air compressor 224 and the fuel cell stack 202 are operable to generate electrical energy using fuel from the fuel tank system 164 and air.

In a hydrogen-fueled implementation, the fuel is hydrogen fuel. In the fuel cell stack 202, each fuel cell includes an anode and a cathode. In each fuel cell, hydrogen fuel is pumped to the anode where, as part of the chemical reaction, hydrogen molecules are activated by an anode catalyst. The hydrogen molecules thereby release electrons, and become hydrogen ions. The released electrons travel from the anode to the cathode, thereby generating electrical current. The electrical current generated by the fuel cells serves as the electrical energy generated by the fuel cell stack 202. In each fuel cell, the hydrogen ions also travel from the anode to the cathode. Oxygen in air from the air compressor 224 is pumped to the cathode where, as part of the chemical reaction, the hydrogen ions bond with oxygen on a cathode catalyst to generate water. In the fuel cell stack 202, the water generated by the fuel cells is a byproduct of generating electrical energy.

Also among the energy elements of the fuel cell system 160, the FCV 100 includes a fluid pump 230 and one or more fans 232. The fluid pump 230 belongs to a coolant circuit that, in addition to the fluid pump 230, includes one or more coolant-to-air heat exchangers 234, and a coolant passage through the fuel cell stack 202. The heat exchangers 234 include one or more radiators and the like.

In relation to the fluid pump 230 and the fans 232, among the attendant energy elements of the energy system 152, the FCV 100 includes a cooling converter 236. The cooling converter 236 is electrically connected to the power supply 214, and the fluid pump 230 and the fans 232 are electrically connected to the cooling converter 236. The cooling converter 236 is operable to condition electrical energy from the power supply 214. Specifically, the cooling converter 236 is a DC/DC converter operable to convert higher voltage DC electrical energy from the power supply 214 into lower voltage DC electrical energy. For instance, with the higher voltage DC electrical energy being medium voltage DC electrical energy, the lower voltage DC electrical energy may be low voltage DC electrical energy. The fluid pump 230 is operable to circulate water or other coolant in the coolant circuit using electrical energy from the cooling converter 236. The fans 232 are operable to induce airflow across the heat exchangers 234 using electrical energy from the cooling converter 236. The heat exchangers 234 are operable to exchange heat between coolant passing through the heat exchangers 234 and airflow across the heat exchangers 234.

As the combined product of circulating coolant in the coolant circuit and inducing airflow across the heat exchangers 234, the fluid pump 230 and the fans 232 are operable to cool coolant passing through the heat exchangers 234. Moreover, further downstream of the heat exchangers 234, the cooled coolant is passed through the coolant passage. Accordingly, in conjunction with the coolant circuit to which the fluid pump 230 belongs, the fluid pump 230 and the fans 232 are operable to cool the fuel cell stack 202.

Also among the energy elements of the fuel cell system 160, the FCV 100 includes another fluid pump 238. The fluid pump 238 belongs to another coolant circuit that, in addition to the fluid pump 238, includes one or more coolant-to-air heat exchangers 240, and a coolant passage through one or more vehicle elements attendant to the fuel cell stack 202. The heat exchangers 240 include one or more radiators and the like. The vehicle elements attendant to the fuel cell stack 202 include any combination of the fuel cell converter 204, the motor inverter 208, the battery converter 212 and the like. The fluid pump 238 is a three-phase AC fluid pump. The fluid pump 238 is electrically connected to the pump inverter 222 and, as noted above, the fans 232 are electrically connected to the cooling converter 236. The fluid pump 238 is operable to circulate water or other coolant in the coolant circuit using electrical energy from the pump inverter 222. The fans 232 are operable to induce airflow across the heat exchangers 240 using electrical energy from the cooling converter 236. The heat exchangers 240 are operable to exchange heat between coolant passing through the heat exchangers 240 and airflow across the heat exchangers 240.

As the combined product of circulating coolant in the coolant circuit and inducing airflow across the heat exchangers 240, the fluid pump 238 and the fans 232 are operable to cool coolant passing through the heat exchangers 240. Moreover, further downstream of the heat exchangers 240, the cooled coolant is passed through the coolant passage. Accordingly, in conjunction with the coolant circuit to which the fluid pump 238 belongs, the fluid pump 238 and the fans 232 are operable to cool the vehicle elements attendant to the fuel cell stack 202.

Figure 3A:
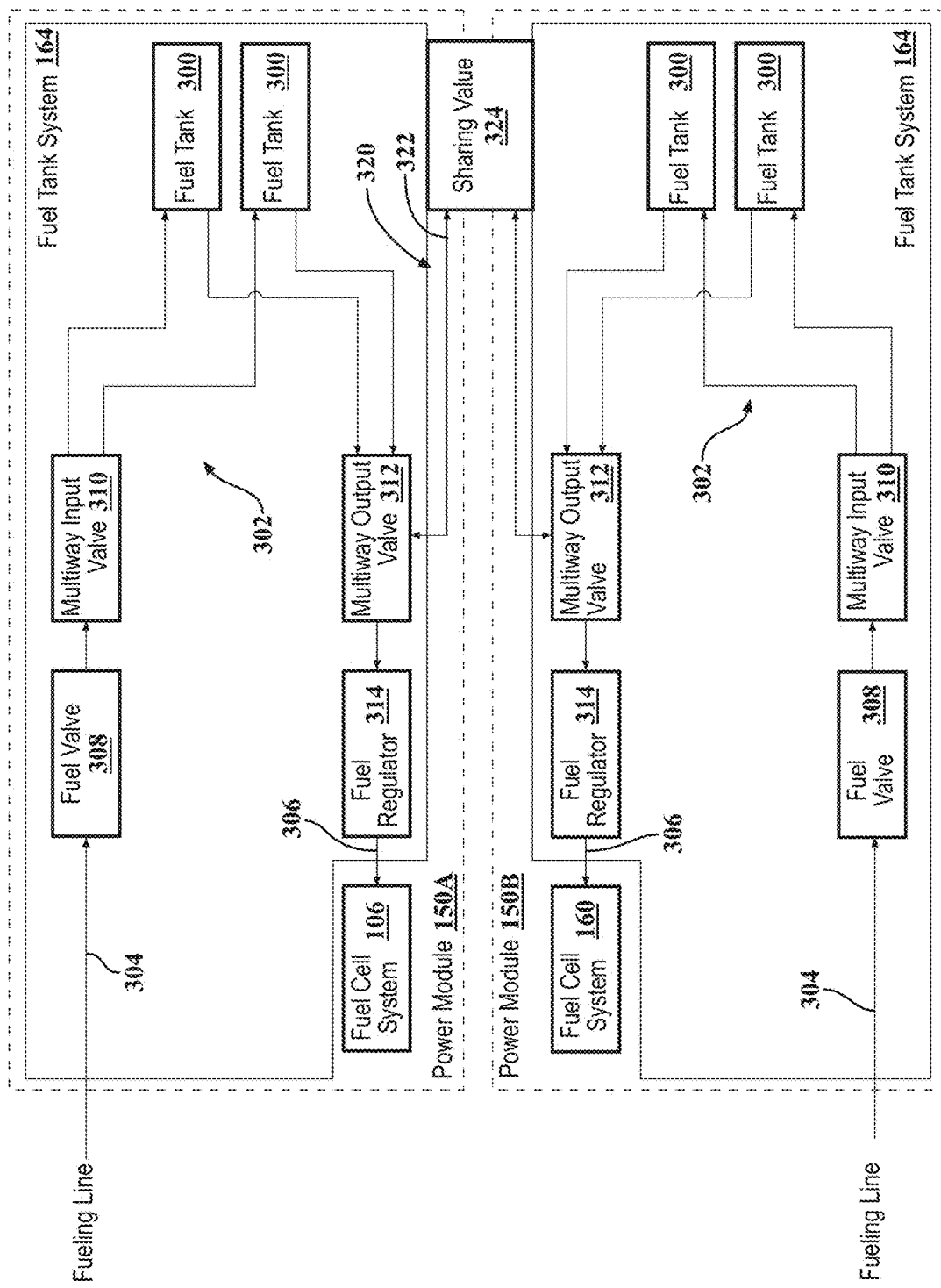
FIG. 3A is a partial portrayal of the FCV using block diagrams, further showing the power modules, including multiple fuel tanks and a piping network for the fuel tanks per fuel tank system.
Figure 3B:
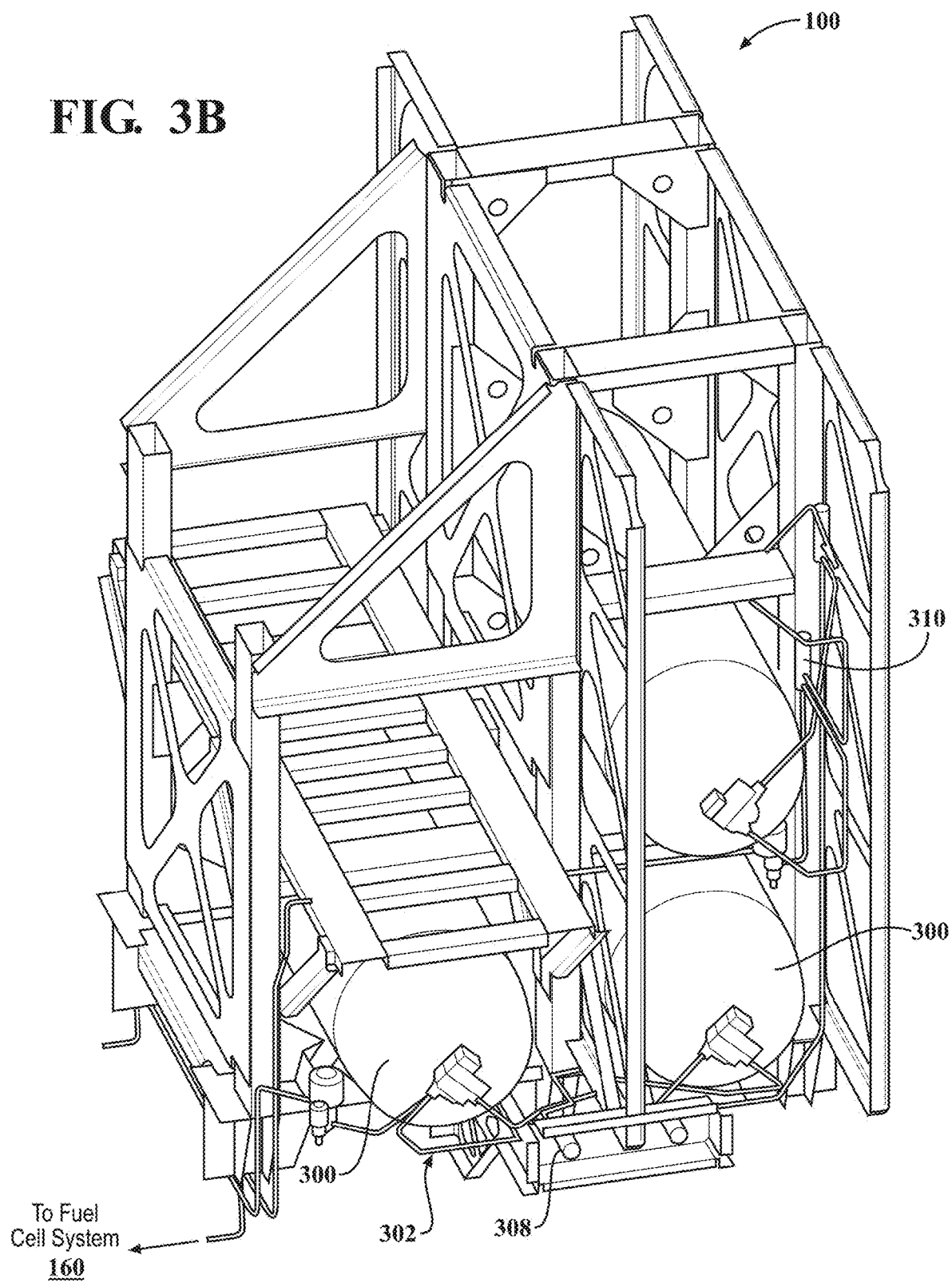
FIG. 3B is a partial portrayal of the FCV using a portion of the perspective exploded view from FIG. 2B, further showing the fuel tank systems.

As shown with additional reference to FIGS. 3A and 3B, the FCV 100 also includes one or more energy elements as part of the fuel tank system 164. Among the energy elements of the fuel tank system 164, the FCV 100 includes one or more fuel tanks 300, as well as a piping network 302 for the fuel tanks 300. Although the FCV 100, as shown, includes two fuel tanks 300 per fuel tank system 164, it will be understood that this disclosure is applicable in principle to otherwise similar vehicles including one fuel tank 300 per fuel tank system 164, as well as otherwise similar vehicles otherwise including multiple fuel tanks 300 per fuel tank system 164. In the hydrogen-fueled implementation, each fuel tank 300 is a high-pressure hydrogen tank, and the piping network 302 is a hydrogen piping network 302. The fuel tanks 300 are operable to store fuel.

From the perspective of the fuel tanks 300, the piping network 302 has an input line 304 and an output line 306. On the input line 304, in addition to the requisite pipes, the piping network 302 includes a fuel valve 308 and a multiway input valve 310. The fuel valve 308 is fluidly connectable to a fueling station's fueling line, the multiway input valve 310 is fluidly connected to the fuel valve 308, and each fuel tank 300 is fluidly connected to the multiway input valve 310. With the FCV 100 including two fuel tanks 300 per fuel tank system 164, the multiway input valve 310 is a two-way input valve. The fuel valve 308 is operable to selectively open or close the input line 304 to the multiway input valve 310. The multiway input valve 310 is operable to selectively open or close the input line 304 to one, some or all of the fuel tanks 300.

With the fuel valve 308 fluidly connected to a fueling line, as the combined product of opening the input line 304 to the multiway input valve 310 and opening the input line 304 to one, some or all of the fuel tanks 300, the fuel valve 308 and the multiway input valve 310 are operable to open a fluid connection from the fueling line to one, some or all of the fuel tanks 300. From the perspective of each fuel tank 300, with a fluid connection opened from the fueling line to the fuel tank 300, the piping network 302 is employable to fill the fuel tank 300 with fuel from the fueling line. Moreover, with a fluid connection opened from the fueling line to multiple fuel tanks 300, the piping network 302 is employable to simultaneously fill the fuel tanks 300 with fuel from the fueling line. Also, as the combined product of closing the input line 304 to the multiway input valve 310 and opening the input line 304 to multiple fuel tanks 300, the fuel valve 308 and the multiway input valve 310 are operable to open a fluid connection between the fuel tanks 300. With a fluid connection opened between the fuel tanks 300, the piping network 302 is employable transfer fuel between the fuel tanks 300.

On the output line 306, in addition to the requisite pipes, the piping network 302 includes a multiway output valve 312 and a fuel regulator 314. The multiway output valve 312 is fluidly connected to each fuel tank 300, the fuel regulator 314 is fluidly connected to the multiway output valve 312, and the fuel cell system 160, at the fuel pump 220, is fluidly connected to the fuel regulator 314. With the FCV 100 including two fuel tanks 300 per fuel tank system 164, the multiway output valve 312 is a two-way output valve. The multiway output valve 312 is operable to selectively open or close the output line 306 from one, some or all of the fuel tanks 300. The fuel regulator 314 is operable to selectively open or close the output line 306 from the multiway output valve 312. Moreover, the fuel regulator 314 is operable to regulate the properties of fuel in the output line 306. Specifically, the fuel regulator 314 is a pressure regulator operable to regulate the pressure of fuel in the output line 306.

As the combined product of opening the output line 306 from one, some or all of the fuel tanks 300 and opening the output line 306 from the multiway output valve 312, the multiway output valve 312 and the fuel regulator 314 are operable to open a fluid connection from one, some or all of the fuel tanks 300 to the fuel cell system 160. From the perspective of each fuel tank 300, with a fluid connection opened from the fuel tank 300 to the fuel cell system 160, the piping network 302 is employable to fuel the fuel cell system 160 with fuel from the fuel tank 300. Moreover, with a fluid connection opened from multiple fuel tanks 300 to the fuel cell system 160, the piping network 302 is employable to simultaneously fuel the fuel cell system 160 with fuel from the fuel tanks 300. Also, as the combined product of opening the output line 306 from multiple fuel tanks 300 and closing the output line 306 from the multiway output valve 312, the multiway output valve 312 and the fuel regulator 314 are operable to open a fluid connection between the fuel tanks 300. With a fluid connection opened between the fuel tanks 300, the piping network 302 is employable transfer fuel between the fuel tanks 300.

Assigned Auxiliary Elements.

With reference once again to FIGS. 2A and 2B, the FCV 100 includes one or more auxiliary elements as part of the braking system 140. Among the auxiliary elements of the braking system 140, the FCV 100 includes an air compressor 250, as well as one or more friction brakes at one, some or all of the wheels 114. The air compressor 250 is electrically connected to the energy supersystem 130. The friction brakes are pneumatically connected to the air compressor 250, and the wheels 114 are mechanically connected to the friction brakes. The air compressor 250 is operable to pump air into the brakes using electrical energy from the energy supersystem 130. The friction brakes are operable to frictionally brake the FCV 100 at the wheels 114 using air from the air compressor 250.

The FCV 100 also includes one or more auxiliary elements as part of the steering system 142. Among the auxiliary elements of the steering system 142, the FCV 100 includes a fluid pump 252, as well as one or more steering mechanisms at one, some or all of the wheels 114. The fluid pump 252 is electrically connected to the energy supersystem 130. The steering mechanisms are hydraulically connected to the fluid pump 252, and the wheels 114 are mechanically connected to the steering mechanisms. The fluid pump 252 is operable to pump power steering fluid into the steering mechanisms using electrical energy from the energy supersystem 130. The steering mechanisms are operable to adjust the steering angle of the wheels 114 using power steering fluid from the fluid pump 252. In a front-wheel steer arrangement, one steering system 142 is operable to adjust the steering angle of both front wheels 114F using power steering fluid from the fluid pump 252. By doing this, the steering mechanisms are operable to steer the FCV 100 as it drives along the ground.

The FCV 100 also includes one or more auxiliary elements as part of the heating/cooling system 144. Among the auxiliary elements of the heating/cooling system 144, the FCV 100 includes a refrigerant compressor 254 and one or more fans 256. The refrigerant compressor 254 belongs to a refrigerant circuit that, in addition to the refrigerant compressor 254, includes one or more refrigerant-to-air heat exchangers 258. The heat exchangers 258 include one or more condensers, one or more evaporators and the like. The refrigerant compressor 254 and the fans 256 are electrically connected to the energy supersystem 130. The refrigerant compressor 254 is operable to suction, compress and discharge refrigerant in the refrigerant circuit using electrical energy from the energy supersystem 130. Accordingly, the refrigerant compressor 254 is operable to circulate refrigerant in the refrigerant circuit. The fans 256 are operable to induce airflow across the heat exchangers 258, and into the passenger compartment 104, the engine compartments 106 or otherwise into the FCV 100 using electrical energy from the energy supersystem 130. The heat exchangers 258 are operable to exchange heat between refrigerant passing through the heat exchangers 258 and airflow across the heat exchangers 258.

As the combined product of circulating refrigerant in the refrigerant circuit and inducing airflow across the heat exchangers 258, the refrigerant compressor 254 and the fans 256 are operable to drive a thermodynamic cycle between refrigerant in the refrigerant circuit and airflow across the heat exchangers 258. Under the thermodynamic cycle, airflow across one or more of the heat exchangers 258 is cooled. Moreover, further downstream of the heat exchangers 258, the cooled airflow is induced into the FCV 100. Accordingly, in conjunction with the refrigerant circuit, the refrigerant compressor 254 and the fans 256 are operable to cool the FCV 100.

Also among the auxiliary elements of the heating/cooling system 144, the FCV 100 includes a heater 260. The heater 260 is electrically connected to the energy supersystem 130. The heater 260 is operable to heat airflow across the heater 260 using electrical energy from the energy supersystem 130. The fans 256 are operable to induce airflow across the heater 260, and into the passenger compartment 104, the engine compartments 106 or otherwise into the FCV 100 using electrical energy from the energy supersystem 130. As the combined product of operating the heater 260 and inducing airflow across the heater 260, the heater 260 and the fans 256 are operable to heat airflow across the heater 260. With the airflow, further downstream of the heater 260, induced into the FCV 100, heated air is supplied to the FCV 100. Accordingly, the heater 260 and the fans 256 are operable to heat the FCV 100.

The FCV 100 also includes one or more auxiliary elements as part of the accessory system 146. Among the auxiliary elements of the accessory system 146, the FCV 100 includes one or more accessories 262. The accessories 262 are typical of vehicles, and include any combination of one or more interior lights, one or more exterior lights, one or more gauges, one or more power seats, one or more infotainment systems and the like. The accessories 262 are electrically connected to the energy supersystem 130. The accessories 262 are operable to illuminate the passenger compartment 104, illuminate the environment surrounding the FCV 100, signal driving intentions, deliver information about the operation of the FCV 100, adjust the position of seats in the FCV 100, deliver infotainment content to users of the FCV 100 and otherwise perform accessory functions using electrical energy from the energy supersystem 130.

For the power module 150A, the assigned auxiliary elements include the fluid pump 252 of the steering system 142. In relation to the fluid pump 252, among the attendant energy elements of the energy supersystem 130, the FCV 100 includes an auxiliary converter 264. The auxiliary converter 264 is electrically connected to the batteries 210 through the junction box 200, and the fluid pump 252 is electrically connected to the auxiliary converter 264. The auxiliary converter 264 is operable to condition electrical energy from the batteries 210. Specifically, the auxiliary converter 264 is a DC/DC converter operable to convert higher voltage DC electrical energy from the batteries 210 into lower voltage DC electrical energy. For instance, with the higher voltage DC electrical energy being medium voltage DC electrical energy, the lower voltage DC electrical energy may be low voltage DC electrical energy. The fluid pump 252 is thus operable to pump power steering fluid into the steering mechanisms of the steering system 142, as noted above, using electrical energy from the auxiliary converter 264.

For the power module 150A, the assigned auxiliary elements also include the refrigerant compressor 254 and the fans 256 of the heating/cooling system 144. In relation to the fans 256, among the attendant energy elements of the energy supersystem 130, the FCV 100 includes the auxiliary converter 264. The refrigerant compressor 254 is electrically connected to the power supply 214. The fans 256 are electrically connected to the auxiliary converter 264. The refrigerant compressor 254 is thus operable to circulate refrigerant in the refrigerant circuit to which the refrigerant compressor 254 belongs, as noted above, using electrical energy from the power supply 214. Moreover, the fans 256 are thus operable to induce airflow across the heat exchangers of the refrigerant circuit, and into the FCV 100, as noted above, using electrical energy from the auxiliary converter 264.

For the power module 150B, the assigned auxiliary elements include the air compressor 250 of the braking system 140. The air compressor 250 is a three-phase AC air compressor. In relation to the air compressor 250, among the attendant energy elements of the energy supersystem 130, the FCV 100 includes an auxiliary inverter 266. The auxiliary inverter 266 is electrically connected to the battery converter 212 through the junction box 200, and the air compressor 250 is electrically connected to the auxiliary inverter 266. The auxiliary inverter 266 is operable to condition electrical energy from the battery converter 212. Specifically, the auxiliary inverter 266 is operable to convert DC electrical energy from the battery converter 212 into three-phase AC electrical energy. For instance, with the DC electrical energy being high voltage DC electrical energy, the three-phase AC electrical energy may be high voltage AC electrical energy. The air compressor 250 is thus operable to pump air into the brakes of the braking system 140, as noted above, using electrical energy from the auxiliary inverter 266.

For the power module 150B, the assigned auxiliary elements also include the heater 260 of the heating/cooling system 144. The heater 260 is electrically connected to the power supply 214. The heater 260 is thus operable to heat airflow across the heater 260, as noted above, using electrical energy from the power supply 214.

For the power module 150B, the assigned auxiliary elements also include the accessories 262 of the accessory system 146. In relation to the accessories 262, among the attendant energy elements of the energy supersystem 130, the FCV 100 includes an auxiliary converter 268. The auxiliary converter 268 is electrically connected to the batteries 210 through the junction box 200, and the accessories 262 are electrically connected to the auxiliary converter 268. The auxiliary converter 268 is operable to condition electrical energy from the batteries 210. Specifically, the auxiliary converter 268 is a DC/DC converter operable to convert higher voltage DC electrical energy from the batteries 210 into lower voltage DC electrical energy. For instance, with the higher voltage DC electrical energy being medium voltage DC electrical energy, the lower voltage DC electrical energy may be low voltage DC electrical energy. The accessories 262 are thus operable to perform accessory functions, as noted above, using electrical energy from the auxiliary converter 268.

Dedicated Batteries.

As noted above, in each power module 150, the FCV 100 includes multiple batteries 210 per battery system 162. In each power module 150, from the perspective of the battery system 162, the batteries 210 include one or more motor batteries 210M or, in other words, batteries 210 dedicated to handling the electrical loads on the battery system 162 from the motor system 166. The electrical loads from the motor system 166 include those from the motor 206. Relatedly, the batteries 210 also include one or more complementary batteries 210C dedicated to handling the remaining electrical loads on the battery system 162. The remaining electrical loads on the battery system 162 include those from the remainder of the energy system 152 besides the motor system 166, including those from the fuel cell system 160, as well as those from the assigned auxiliary elements.

Motor Assembly.

Figure 4:
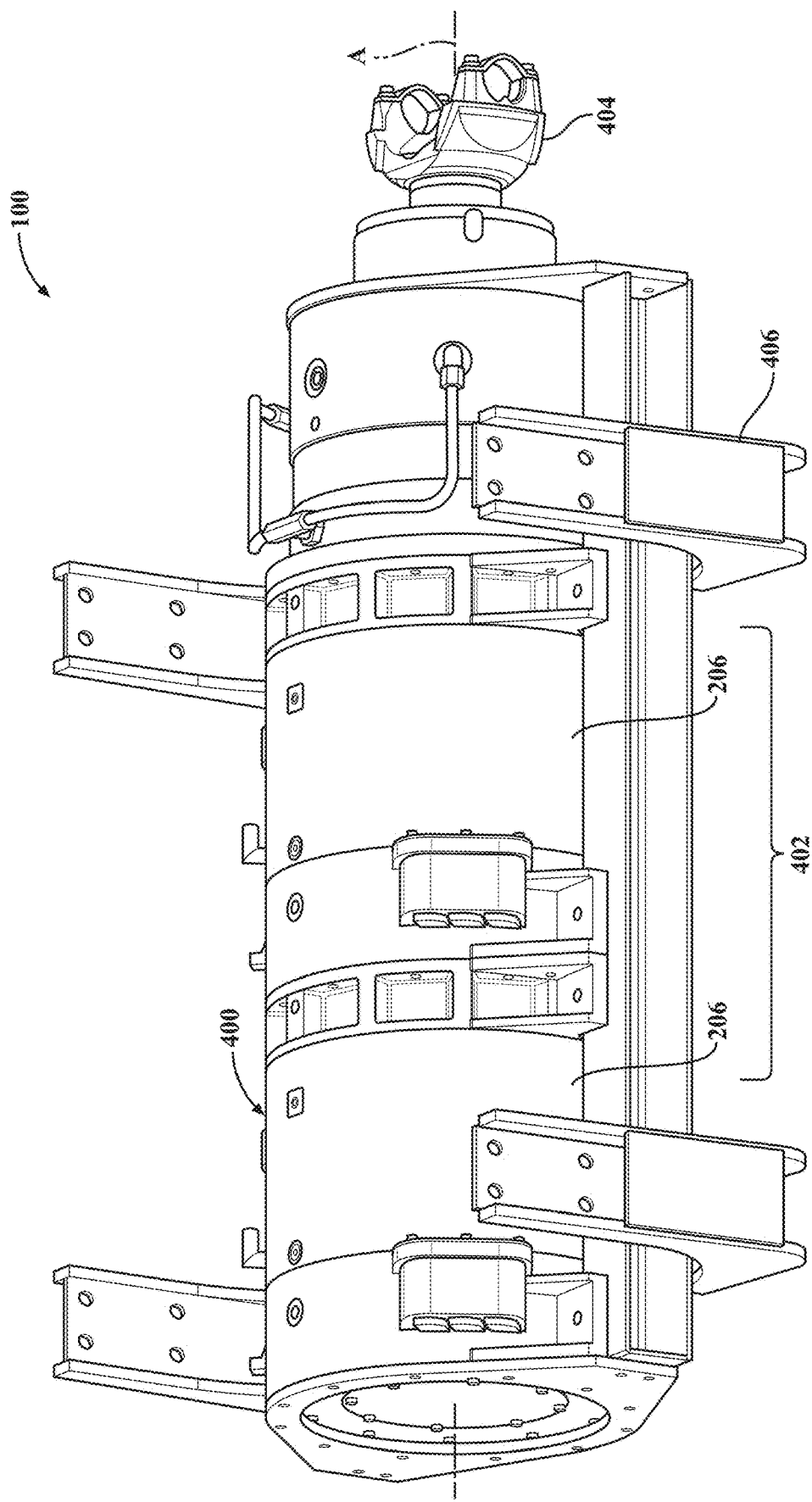
FIG. 4 is a partial portrayal of the FCV using a portion of the perspective exploded view from FIG. 2B, showing a motor assembly to which the motors belong.

As noted above, in each power module 150, the FCV 100 includes one or more motors 206 per motor system 166. Among other things, it follows that the FCV 100 includes multiple motors 206. As shown with additional reference to FIG. 4, in the FCV 100, the motors 206 belong to a common motor assembly 400, and the drivetrain is mechanically connected to the motor assembly 400 as part of the electrified powertrain for the FCV 100.

The motor assembly 400 has a motor axis A. The motor axis A serves as the axis of rotation for the motor assembly 400. The motors 206 are axially aligned with one another along the motor axis A. Each motor 206 is operable to spin about the motor axis A using electrical energy. Notwithstanding belonging to different power modules 150, in the motor assembly 400, the motors 206 form a motor chain 402. In the motor chain 402, the motors 206 are axially integrated for codependent spinning action. To form the motor chain 402, from the head of the motor chain 402 to its tail, the output shaft of one motor 206 is mechanically connected to the input shaft of the next motor 206.

In addition to the motors 206, the motor assembly 400 includes a common output coupling 404 along the motor axis A. The output coupling 404 is mechanically connected to the motors 206 at the tail of the motor chain 402. Specifically, the output coupling 404 is mechanically connected to the output shaft of the motor 206 at the tail of the motor chain 402. With the motors 206 together thus supporting the output coupling 404 for rotation about the motor axis A, each motor 206, as a product of spinning about the motor axis A, is operable to spin the output coupling 404 about the motor axis A using electrical energy.

In the drivetrain, any penultimate combination of a transmission, a differential, a drive shaft and the like, to which the wheels 114 are mechanically connected, is mechanically connected to the output coupling 404. With the drivetrain thus mechanically connected to the motors 206, in conjunction with the drivetrain, and as the product of spinning the output coupling 404 about the motor axis A, each motor 206 is operable to power the wheels 114 using electrical energy. Specifically, each motor 206 is operable to power the wheels 114 using electrical energy from the energy system 152 of the power module 150 to which it and the energy system 152 belong. Among other things, it follows that the wheels 114 are subject to being powered by any combination of the motors 206. However, as opposed to the codependent spinning action by the motors 206 in the mechanical domain, the wheels 114 are subject to being powered using electrical energy from any combination of the energy systems 152 of the power modules 150 to which the motors 206 and the energy systems 152 respectively belong. As the product of the wheels 114 spinning the output coupling 404 about the motor axis A, each motor 206 is also operable to generate electrical energy using the wheels 114, and consequently retard the wheels 114.

In relation to the motor assembly 400, the FCV 100 includes a common motor cradle 406. The motor cradle 406 is mounted to or otherwise supported by the chassis 110. The motors 206 are mounted to the motor cradle 406 in axial alignment with one another along the motor axis A. The motor axis A, as shown, is longitudinal to facilitate the mechanical connection from the drivetrain to the output coupling 404.

As is typical for semi-tractor applications, the drivetrain is predominantly lower (i.e., closer to the ground) than the chassis 110. With the motor cradle 406 mounted to the chassis 110, the motors 206 mounted to the motor cradle 406 and the motors 206 supporting the output coupling 404, the drivetrain is predominantly lower than the output coupling 404 as well. Notwithstanding, the motor cradle 406 is configured relative to the chassis 110 to carry the motors 206 horizontally to the ground. Relatedly, to make up the elevation difference between the drivetrain and the output coupling 404, the drivetrain is, at least in part, inclined toward the output coupling 404. Accordingly, the motors 206 do not suffer the threat of unpredictable vibrations that could otherwise be present if the motors 206 were instead inclined toward the drivetrain to make up the elevation difference, or otherwise not carried horizontally to the ground.

Packaging.

Figure 5:
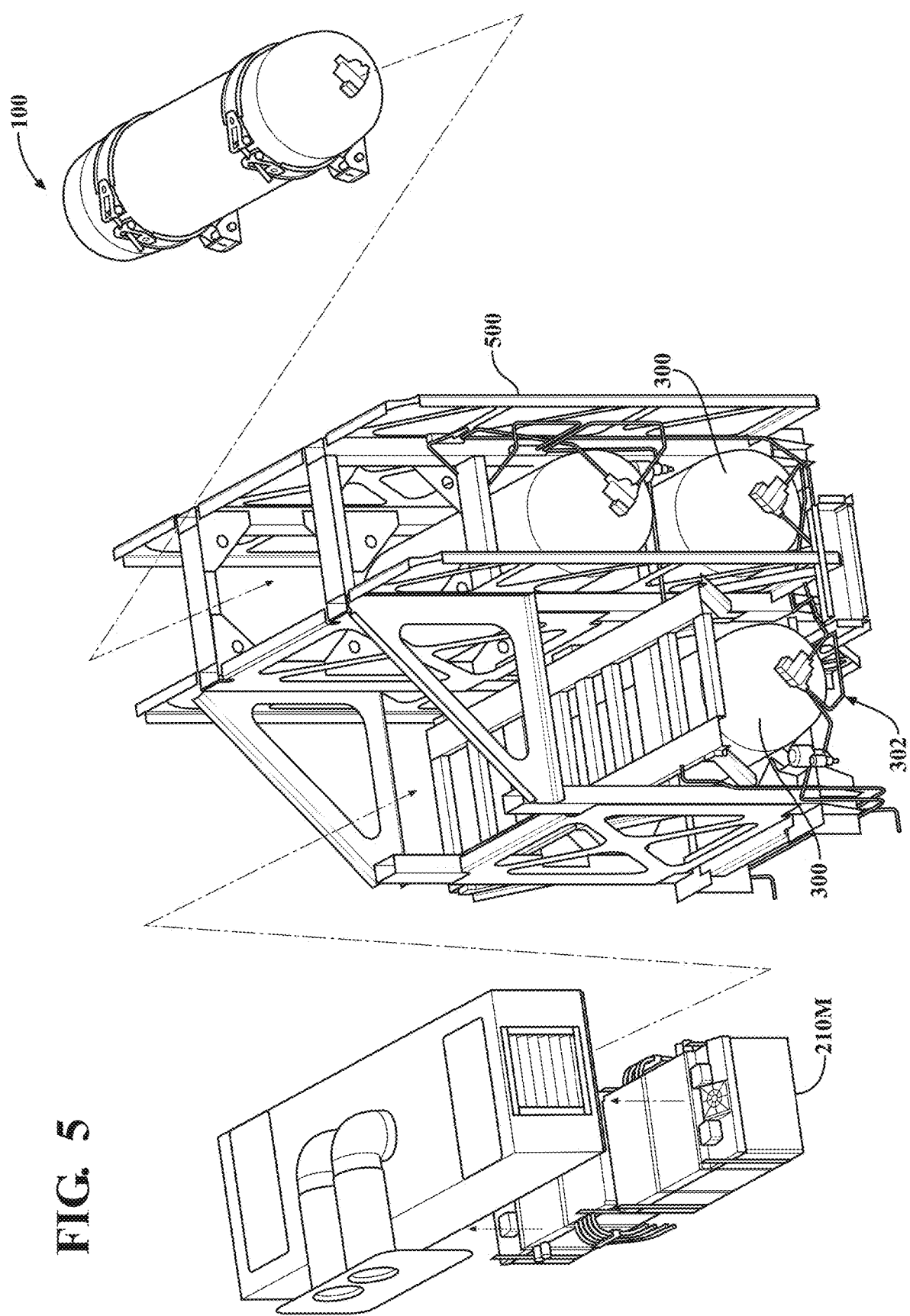
FIG. 5 is a partial portrayal of the FCV using a portion of the perspective exploded view from FIG. 2B, further showing certain batteries and the fuel tanks mounted to a support rack.

As noted above, in each power module 150, the FCV 100 includes multiple batteries 210, including one or more motor batteries 210M, per battery system 162. Moreover, in each power module 150, the FCV 100 includes one or more fuel tanks 300 per fuel tank system 164. Among other things, it follows that the FCV 100 includes multiple motor batteries 210M and multiple fuel tanks 300. As shown with additional reference to FIG. 5, in relation to any combination of the motor batteries 210M and the fuel tanks 300, the FCV 100 includes a common support rack 500. The support rack 500 is mounted to or otherwise supported by the chassis 110. Notwithstanding belonging to different power modules 150, the motor batteries 210M are mounted to the support rack 500 adjacent to one another. Accordingly, the motor batteries 210M, as well as one or more attendant energy elements of the energy supersystem 130, are localized in the FCV 100 for packaging purposes. Similarly notwithstanding belonging to different power modules 150, the fuel tanks 300 are also mounted to the support rack 500 adjacent one another. Accordingly, the fuel tanks 300, as well as the piping networks 302 for the fuel tanks 300, are localized in the FCV 100 for packaging purposes.

Figure 6:
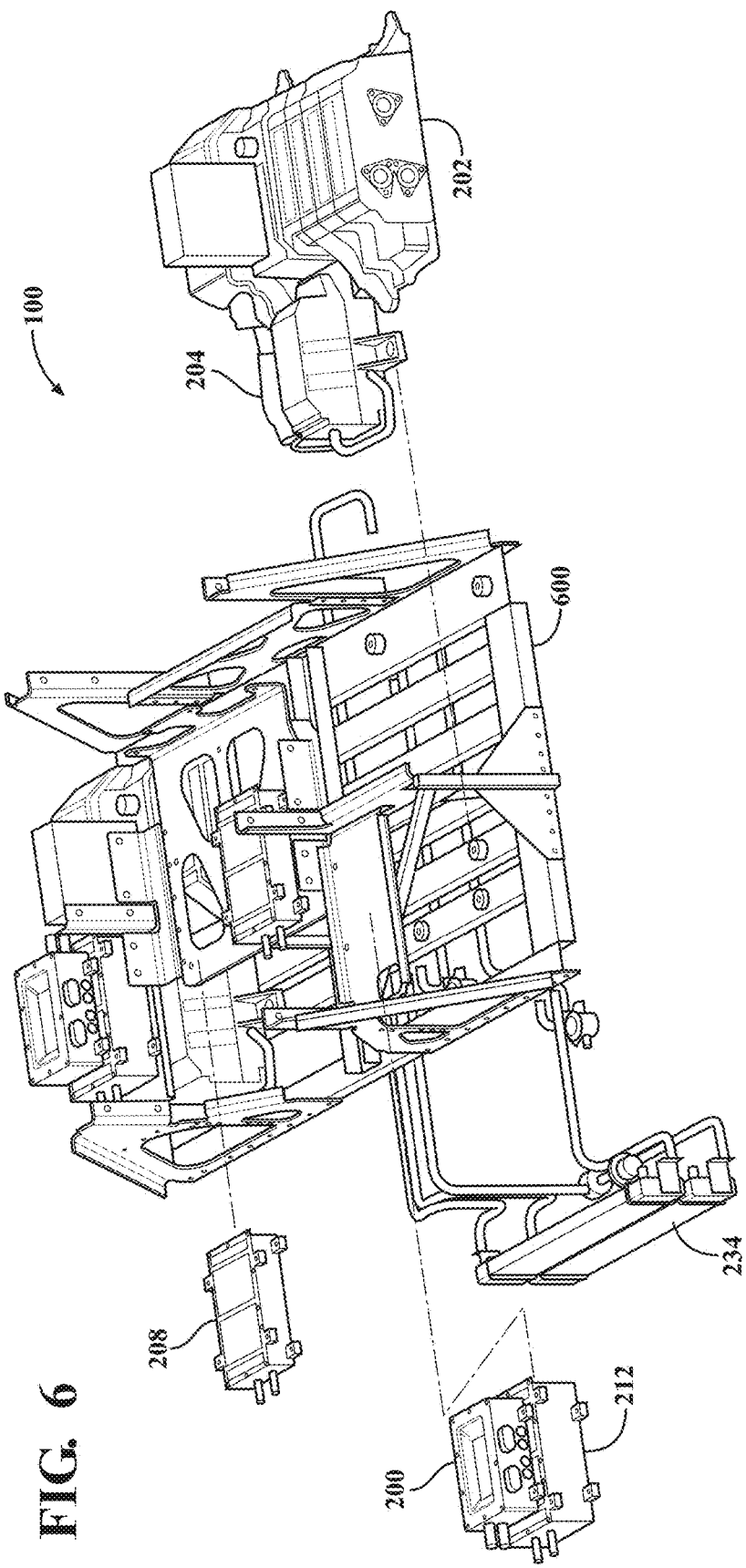
FIG. 6 is a partial portrayal of the FCV using a portion of the perspective exploded view from FIG. 2B, further showing the fuel cell stacks and certain other vehicle elements mounted to another support rack.

As also noted above, in each power module 150, the FCV 100 includes one or more fuel cell stacks 202 per fuel cell system 160, as well as a junction box 200, a fuel cell converter 204, a motor inverter 208 and a battery converter 212. Among other things, it follows that the FCV 100 includes multiple fuel cell stacks 202, as well as multiple junction boxes 200, multiple fuel cell converters 204, multiple motor inverters 208 and multiple battery converters 212. As shown with additional reference to FIG. 6, in relation to any combination of the fuel cell stacks 202, the junction boxes 200, the fuel cell converters 204, the motor inverters 208 and the battery converters 212, the FCV 100 includes another common support rack 600. The support rack 600 is mounted to or otherwise supported by the chassis 110. Notwithstanding belonging to different power modules 150, the fuel cell stacks 202 are mounted to the support rack 600 adjacent to one another. Accordingly, the fuel cell stacks 202, as well as one or more attendant energy elements of the energy supersystem 130, are localized in the FCV 100 for packaging purposes. Similarly notwithstanding belonging to different power modules 150, any combination of the junction boxes 200, the fuel cell converters 204, the motor inverters 208 and the battery converters 212 are also mounted to the support rack 600 adjacent one another. Accordingly, the junction boxes 200, the fuel cell converters 204, the motor inverters 208 and the battery converters 212 are localized in the FCV 100 for packaging purposes.

Load Balancing and Resource Balancing.

Generally speaking, from the perspective of the power modules 150, the use of resources is commensurate with the satisfaction of global vehicle demands. One goal of contributorily satisfying global vehicle demands is resource balancing or, in other words, balancing fuel, electrical energy and other resources between the power modules 150. Specifically, resource balancing is the product of load balancing or, in other words, balancing electrical and other loads between the power modules 150. And load balancing, in turn, is the product of contributorily satisfying global vehicle demands.

For instance, as the product of contributorily satisfying global vehicle demands, under the resulting load balancing, the electrical loads on the batteries 210 of one power module 150 are balanced with the corresponding electrical loads on their counterparts of the remaining power module 150. Moreover, further upstream, the electrical loads on the fuel cell stack 202 of one power module 150 are balanced with the corresponding electrical loads on its counterpart of the remaining power module 150. And, for instance, under the resulting resource balancing, the states of charge of the batteries 210 of one power module 150 are balanced with the corresponding states of charge of their counterparts of the remaining power module 150. Moreover, the fuel reserves of the fuel tanks 300 of one power module 150 are balanced with the corresponding fuel reserves of their counterparts of the remaining power module 150.

Notwithstanding contributorily satisfying global propulsion demands, one or more load imbalances may be latent in the operation of the FCV 100. With reference once again to FIGS. 2A and 2B, as noted above, in each power module 150, the FCV 100 includes multiple batteries 210, including one or more motor batteries 210M and one or more complementary batteries 210C, per battery system 162, as well as the junction box 200. The motor 206 is electrically connected to the motor batteries 210M through the junction box 200. Moreover, the assigned auxiliary elements are electrically connected to the complementary batteries 210C through the junction box 200. For instance, in relation to the motor batteries 210M, the latent load imbalances may include that the electrical loads on the motor batteries 210M from the motor 206 of one power module 150 are imbalanced from the corresponding electrical loads on their counterparts of the remaining power module 150. Moreover, in relation to the complementary batteries 210C, and despite best efforts assigning the auxiliary elements to the power modules 150, the latent load imbalances may include that the electrical loads on the complementary batteries 210C from the assigned auxiliary elements of one power module 150 are imbalanced from the corresponding electrical loads on their counterparts of the remaining power module 150.

Among other things, it follows that although, in principle, load balancing is the product of contributorily satisfying global vehicle demands, one or more load imbalances may nonetheless be latent in the operation of the FCV 100. Similarly to resource balancing being the product of load balancing, resource imbalances are the product of load imbalances. And, with resource imbalances being the product of load imbalances, one or more resource imbalances may be latent in the operation of the FCV 100 as well. For purposes of preventing the latent resource imbalances, the FCV 100 includes one or more preventative resource balancing countermeasures. Generally speaking, the preventative resource balancing countermeasures are operable to prevent the latent load imbalances, and thereby prevent the otherwise resulting latent resource imbalances.

For instance, among the attendant energy elements of the energy supersystem 130, the FCV 100 includes a connecting/switching unit 270. The connecting/switching unit 270 is electrically connected across the power modules 150. Specifically, in the FCV 100, the junction boxes 200 are electrically connected to one another through the connecting/switching unit 270. In relation to the connecting/switching unit 270, in each power module 150, as part of the junction box 200, the FCV 100 includes an intra-power-module motor-load-handling electrical connection or, in other words, a one-to-one electrical connection between the motor 206 and the motor batteries 210M. Moreover, the FCV 100 includes an intra-power-module auxiliary-element-load-handling electrical connection or, in other words, a one-to-one electrical connection between the assigned auxiliary elements and the complementary batteries 210C.

The connecting/switching unit 270 includes electrical switches and the like. The connecting/switching unit 270 is operable to selectively make an inter-power-module motor-load-sharing electrical connection or, in other words, an electrical connection, across the power modules 150, between the motor batteries 210M of one power module 150 and their counterparts of the remaining power module 150. With the inter-power-module motor-load-sharing electrical connection made, the connecting/switching unit 270 is employable to share the combined electrical loads from the motors 206 equally among the motor batteries 210M. The connecting/switching unit 270 is also operable to selectively make an inter-power-module auxiliary-element-load-sharing electrical connection or, in other words, an electrical connection, across the power modules 150, between the complementary batteries 210C of one power module 150 and their counterparts of the remaining power module 150. With the inter-power-module auxiliary-element-load-sharing electrical connection made, the connecting/switching unit 270 is employable to share the combined electrical loads from the auxiliary systems 134 on an unassigned basis equally among the complementary batteries 210C.

The connecting/switching unit 270 is also operable to selectively unmake the intra-power-module auxiliary-element-load-handling electrical connections. At the same time, in their place, the connecting/switching unit 270 is also operable to selectively make inter-power-module auxiliary-element-load-switching electrical connections or, in other words, a one-to-one electrical connection between the assigned auxiliary elements of one power module 150 and the complementary batteries 210C of the remaining power module 150, and a one-to-one electrical connection between the assigned auxiliary elements of the remaining power module 150 and the complementary batteries 210C of the one power module 150. With the intra-power-module auxiliary-element-load-handling electrical connections unmade, and the inter-power-module auxiliary-element-load-switching electrical connections made in their place, the connecting/switching unit 270 is employable to switch the electrical loads from the assigned auxiliary elements between the complementary batteries 210C. Likewise, with the intra-power-module auxiliary-element-load-handling electrical connections remade, and the inter-power-module auxiliary-element-load-switching electrical connections unmade, the connecting/switching unit 270 is employable to switch the electrical loads from the assigned auxiliary elements between the complementary batteries 210C once more. Moreover, as the product of switching the electrical loads from the assigned auxiliary elements between the complementary batteries 210C on a cycled basis, the connecting/switching unit 270 is employable to time-average the electrical loads from the assigned auxiliary elements between the complementary batteries 210C.

As noted above, the preventative resource balancing countermeasures are operable to prevent the latent load imbalances, and thereby prevent the otherwise resulting latent resource imbalances. Notwithstanding preventing the latent load imbalances, one or more load imbalances may materialize in the operation of the FCV 100. And, with resource imbalances being the product of load imbalances, one or more resource imbalances may materialize in the operation of the FCV 100 as well.

Specifically, one power module 150 may become a "low" power module 150 or, in other words, a power module 150 low on any combination of resources in comparison to the remaining "high" power module 150. For instance, under the resulting resource imbalances, the states of charge of the batteries 210 of the low power module 150 may be lower than the corresponding states of charge of their counterparts of the high power module 150. Additionally, or alternatively, the fuel reserves of the fuel tanks 300 of the low power module 150 may be lower than the corresponding fuel reserves of their counterparts of the high power module 150. As a complement to the preventative resource balancing countermeasures, and for purposes of correcting the resource imbalances, the FCV 100 includes one or more corrective resource balancing countermeasures. Generally speaking, the corrective resource balancing countermeasures are operable to correct the resource imbalances.

For instance, the control modules 128 have a "catch up" mode when a low power module 150 is identified. In the catch up mode, as part of the orchestration of the global operation of the FCV 100, the control modules 128 adjust the contributory satisfaction of global vehicle demands in favor of the low power module 150. For instance, the control modules 128 adjust the contributory satisfaction of global energy demands between the energy systems 152 in favor of the low power module 150. Specifically, given a global energy demand, the control modules 128 operate the energy system 152 of the low power module 150 to satisfy a lesser-than-normal share of the global energy demand. Relatedly, the control modules 128 operate the energy system 152 of the high power module 150 to satisfy a greater-than-normal share of the global energy demand. Additionally, or alternatively, the control modules 128 adjust the contributory satisfaction of global propulsion demands between the propulsion systems 154 in favor of the low power module 150. Specifically, given a global propulsion demand, the control modules 128 operate the propulsion system 154 of the low power module 150 to satisfy a lesser-than-normal share of the global propulsion demand. Relatedly, the control modules 128 operate the propulsion system 154 of the high power module 150 to satisfy a greater-than-normal share of the global propulsion demand. With the use of resources being commensurate with the satisfaction of global vehicle demands, among other things, it follows that the catch up mode is employable to allow the low power module 150 to use less of, and thereby catch up on, any combination of resources in comparison to the high power module 150.

As noted above, in each power module 150, the FCV 100 includes one or more fuel tanks 300, as well as a piping network 302 for the fuel tanks 300, per fuel tank system 164. Each piping network 302 is an intra-power-module piping network 302. With reference once again to FIGS. 3A and 3B, also among the corrective resource balancing countermeasures, among the energy elements of the energy supersystem 130, the FCV 100 includes an inter-power-module piping network 320 for the fuel tanks 300. The inter-power-module piping network 320 has a sharing line 322, across the power modules 150, between the intra-power-module piping networks 302. Although the sharing line 322, as shown, is between the intra-power-module piping networks 302 at the multiway output valves 312, it will be understood that this disclosure is applicable in principle to otherwise similar vehicles including an inter-power-module piping network having a sharing line otherwise between the intra-power-module piping networks 302. On the sharing line 322, in addition to the requisite pipes, the inter-power-module piping network 320 includes a sharing valve 324. The multiway output valves 312 are fluidly connected to one another through the sharing valve 324. The sharing valve 324 is operable to selectively open or close the sharing line 322 between the multiway output valves 312. As the combined product of opening the sharing line 322 between the multiway output valves 312 and, in each power module 150, opening the output line 306 from some or all of the fuel tanks 300 and closing the output line 306 from the multiway output valve 312, the sharing valve 324, the multiway output valves 312 and the fuel regulators 314 are operable to open a fluid connection between any combination of the fuel tanks 300. With a fluid connection opened between the fuel tanks 300, the intra-power-module piping networks 302 and the inter-power-module piping networks 302 are employable transfer fuel between the fuel tanks 300.

Among other things, it follows that the advantages of the intra-power-module piping networks 302 and the inter-power-module piping network 320 also include time and effort efficiencies when fueling the FCV 100 at a fueling station. For instance, assuming only one available fueling line, the fueling line does not have to be moved from fuel tank 300 to fuel tank 300. Instead, in each power module 150, the intra-power-module piping network 302 is employable to simultaneously fill the fuel tanks 300 with fuel from the fueling line. Moreover, in conjunction with the intra-power-module piping networks 302, the inter-power-module piping network 320 is employable to simultaneously fill the fuel tanks 300 in each power module 150 with fuel from the fueling line. On the other hand, assuming multiple available fueling lines, in each power module 150, the intra-power-module piping network 302 is employable to simultaneously fill the fuel tanks 300 with fuel from its own fueling line.

Operating the FCV

The FCV 100 is equipped, in operation, to perform vehicle functions on behalf of the FCV 100, and thereby satisfy corresponding vehicle demands on behalf of the FCV 100. As noted above, from the perspective of the global control module 128G and the power control modules 128P, and the orchestration of the global operation of the FCV 100, the vehicle demands include the global vehicle demands. From the perspective of the power control modules 128P, and the orchestration of the operation of the power modules 150, the vehicle demands additionally include one or more local vehicle demands or, in other words, vehicle demands that follow-on the global vehicle demands, but are individual to the power modules 150, as opposed to common to the FCV 100. Specifically, one or more of the energy demands are local energy demands, and one or more of the propulsion demands are local propulsion demands. For each power control module 128P and the assigned power module 150, the local energy demands may include any combination of one or more demands to generate electrical energy using fuel from the fuel tank system 164 and air, one or more demands to store electrical energy from the fuel cell stack 202, one or more demands to condition and otherwise handle electrical energy, one or more demands to cool the fuel cell stack 202, one or more demands to cool the vehicle elements attendant to the fuel cell stack 202, and one or more demands to store and otherwise handle fuel. The local propulsion demands may include one or more demands to power the wheels 114 using electrical energy from any combination of the fuel cell stack 202 and the batteries 210.

Figure 7:
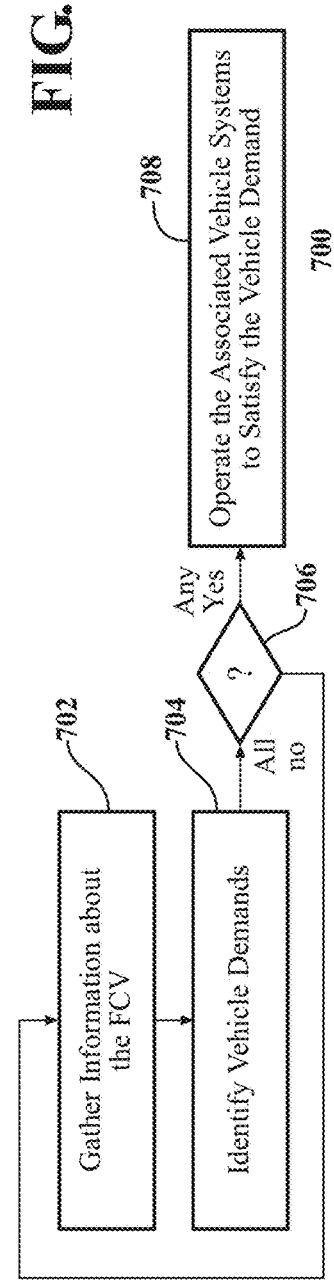
FIG. 7 is a flowchart showing the operations of a process by which the control modules orchestrate the operation of the FCV.

The operations of a process 700 for operating the FCV 100 under the orchestration of the control modules 128 are shown in FIG. 7. According to the process 700, the control modules 128 orchestrate the operation of the FCV 100. The operations of the process 700 are applicable in principle to any combination of the control modules 128 in relation to any combination of the vehicle demands, including any combination of the global vehicle demands, and any combination of the local vehicle demands. For instance, the operations of the process 700 are applicable in principle to each power control module 128P in relation to any combination of the global vehicle demands, and any combination of the local vehicle demands.

In operation 702, the control modules 128 gather information about the FCV 100, including any combination of the information about the FCV 100 detected by the sensor system 122 and information about the FCV 100 communicated between the control modules 128. In operation 704, the control modules 128 evaluate the information about the FCV 100, including monitoring for and identifying one or more vehicle demands. Any combination of control modules 128 may be tasked with the first instance of identifying a vehicle demand. Accordingly, from the perspective of a control module 128, an identified vehicle demand may have been self-identified by the control module 128, identified by the control module 128 and one or more collaborating control modules 128, or communicated from one or more originating control modules 128.

In operations 706 and 708, the control modules 128 operate the vehicle systems 120 based on their evaluation of the information about the FCV 100. Specifically, when, in operation 706, the control modules 128 do not identify a vehicle demand, the control modules 128 do not operate the associated vehicle systems 120. Otherwise, when the control modules 128 identify a vehicle demand in operation 706, in operation 708, the control modules 128 operate the associated vehicle systems 120 to satisfy the vehicle demand. For instance, when the control modules 128 identify an energy demand in operation 706, the control modules 128 operate the energy supersystem 130 to satisfy the energy demand in operation 708. And, when the control modules 128 identify a propulsion demand in operation 706, the control modules 128 operate the propulsion supersystem 132 to satisfy the propulsion demand in operation 708. Moreover, when the control modules 128 identify an auxiliary demand in operation 706, the control modules 128 operate the auxiliary systems 134 to satisfy the auxiliary demand in operation 708.

In both cases, the control modules 128 continue to gather information about the FCV 100 according to operation 702, and continue to evaluate the information about the FCV 100 according to operation 704. Following not operating the vehicle systems 120, as part of their continued evaluation of the information about the FCV 100 according to operation 704, the control modules 128 continue to identify vehicle demands in anticipation that previously-unidentified vehicle demands will materialize. On the other hand, following operating the associated vehicle systems 120 to satisfy the vehicle demand according to operation 708, as part of their continued evaluation of the information about the FCV 100 according to operation 704, the control modules 128 continue to identify vehicle demands in anticipation that the previously-identified vehicle demand will be satisfied. When the previously-identified vehicle demand is satisfied, and the previously-identified vehicle demand is thus no longer identified according to operation 704, the control modules 128 conclude operating the associated vehicle systems 120.

Also as part of their continued evaluation of the information about the FCV 100 according to operation 704, the control modules 128 conduct operational status checks on one or more of the vehicle systems 120, including one, some or all of the associated vehicle systems 120. When one or more associated vehicle systems 120 fail an operational status check, the control modules 128 may conclude operating the inoperative associated vehicle systems 120. The control modules 128 may also conclude operating one, some or all of the remaining, still-operable associated vehicle systems 120, if any, as well as one or more vehicle systems 120 attendant to the inoperative associated vehicle systems 120.

For purposes of identifying vehicle demands, conducting operational status checks on the vehicle systems 120 and otherwise evaluating information about the FCV 100 according to operation 704, the control modules 128 may gather any combination of information about user requests and information about the operation of the FCV 100. This and other information about the FCV 100 may be detected by the sensor system 122. The information about user requests may include any combination of user inputs requesting powering the wheels 114, user inputs requesting braking, steering and the like, user inputs requesting heating, cooling and the like, as well as user inputs requesting accessory functions. The information about the operation of the FCV 100 may include any combination of the location and motion of the FCV 100, the movement of the wheels 114, temperatures of the FCV 100, and the operational statuses of one, some or all of the vehicle systems 120.

Master/Slave Control Relationship.

In the FCV 100, the power control modules 128P have a master/slave control relationship. Specifically, one power control module 128P is established as a master power control module 128P, and the remaining power control module 128P is established as a slave power control module 128P.

With the master power control module 128P established, the PCU to which the master power control module 128P belongs is established as a master PCU, and the power module 150 assigned to the master power control module 128P is established as a master-assigned power module 150. Moreover, the energy system 152 of the master-assigned power module 150 is established as a master-assigned energy system 152, the propulsion system 154 of the master-assigned power module 150 is established as a master-assigned propulsion system 154, and the auxiliary elements assigned to the master-assigned power module 150 are established as master-assigned auxiliary elements. Relatedly, with the slave power control module 128P established, the PCU to which the slave power control module 128P belongs is established as a slave PCU, and the power module 150 assigned to the slave power control module 128P is established as a slave-assigned power module 150. Moreover, the energy system 152 of the slave-assigned power module 150 is established as a slave-assigned energy system 152, the propulsion system 154 of the slave-assigned power module 150 is established as a slave-assigned propulsion system 154, and the auxiliary elements assigned to the slave-assigned power module 150 are established as slave-assigned auxiliary elements.

Figure 8:
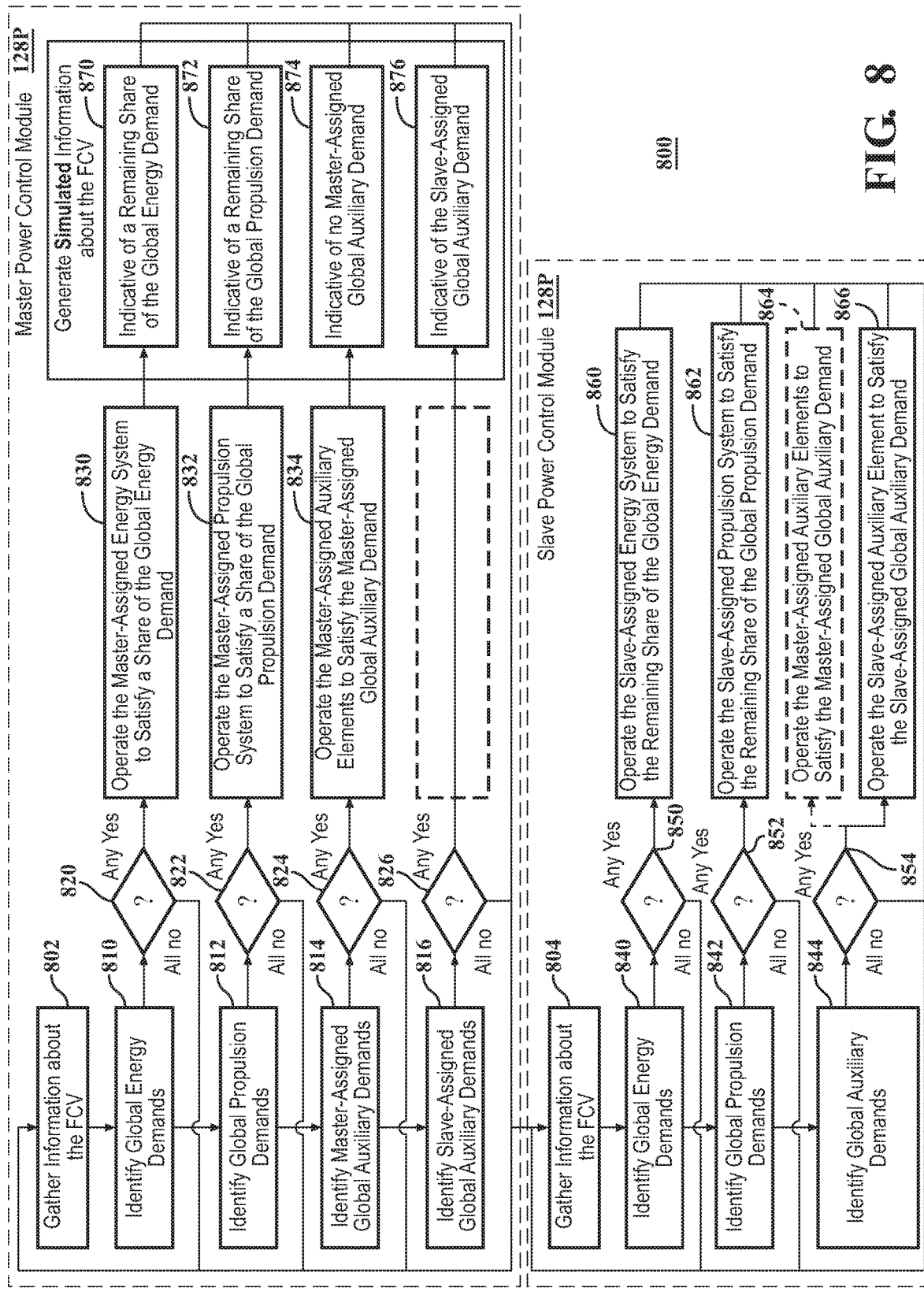
FIG. 8 is a flowchart showing the operations of a process by which the control modules orchestrate the operation of the FCV under a master/slave control relationship in which the power control modules include a master power control module and a slave power control module assigned to respective power modules.

The operations of a process 800 for operating the FCV 100 under the orchestration of the master power control module 128P and the slave power control module 128P are shown in FIG. 8. According to the process 800, the master power control module 128P orchestrates the operation of the master-assigned power module 150, including the operation of the master-assigned energy system 152 and the operation of the master-assigned propulsion system 154, as well as the operation of the master-assigned auxiliary elements. Moreover, the slave power control module 128P orchestrates the operation of the slave-assigned power module 150, including the operation of the slave-assigned energy system 152 and the operation of the slave-assigned propulsion system 154, as well as the operation of the slave-assigned auxiliary elements. In furtherance to the operations of the process 700, the operations of the process 800 are applicable in principle to the master power control module 128P and the slave power control module 128P in relation to any combination of the global vehicle demands.

In operation 802, the master power control module 128P gathers information about the FCV 100. Meanwhile, in operation 804, the slave power control module 128P also gathers information about the FCV 100. In operations 810-816, the master power control module 128P evaluates the information about the FCV 100, including monitoring for one or more global vehicle demands. Specifically, the master power control module 128P identifies one or more global energy demands, in operation 810, and one or more global propulsion demands, in operation 812. Moreover, in operation 814, the master power control module 128P identifies one or more master-assigned global auxiliary demands or, in other words, the global auxiliary demands that the master-assigned auxiliary elements are operable to satisfy. Similarly, in operation 816, the master power control module 128P identifies one or more slave-assigned global auxiliary demands or, in other words, the global auxiliary demands that the slave-assigned auxiliary elements are operable to satisfy.

In operations 820-826 and operations 830-834, the master power control module 128P operates the vehicle systems 120 based on its evaluation of the information about the FCV 100. Specifically, when, in operations 820-826, the master power control module 128P does not identify a global vehicle demand, the master power control module 128P does not operate the master-assigned associated vehicle systems 120. Otherwise, when the master PCU identifies a global vehicle demand in operations 820-824, in operations 830-834, the master power control module 128P operates the master-assigned associated vehicle systems 120 to contributorily satisfy the global vehicle demand. For instance, when the master power control module 128P identifies a global energy demand in operation 820, the master power control module 128P operates the master-assigned energy system 152 to satisfy a share of the global energy demand in operation 830. And, when the master power control module 128P identifies a global propulsion demand in operation 822, the master power control module 128P operates the master-assigned propulsion system 154 to satisfy a share of the global propulsion demand in operation 832. Moreover, when the master power control module 128P identifies a master-assigned global auxiliary demand in operation 824, the master power control module 128P operates the master-assigned auxiliary elements to satisfy the master-assigned global auxiliary demand in operation 834.

Meanwhile, in operations 840-844, the slave power control module 128P also evaluates the information about the FCV 100, including independently monitoring for one or more global vehicle demands. Specifically, the slave power control module 128P identifies one or more global energy demands, in operation 840, and one or more global propulsion demands, in operation 842. Moreover, in operation 844, the slave power control module 128P identifies one or more global auxiliary demands, including one or more slave-assigned global auxiliary demands.

In operations 850-854 and operations 860-864, the slave power control module 128P operates the vehicle systems 120 based on its evaluation of the information about the FCV 100. Specifically, when, in operations 850-854, the slave power control module 128P does not identify a global vehicle demand, the slave power control module 128P does not operate the slave-assigned associated vehicle systems 120. Otherwise, when the slave PCU identifies a global vehicle demand in operations 850-854, in operations 860-864, the slave power control module 128P operates the slave-assigned associated vehicle systems 120 to contributorily satisfy the global vehicle demand. For instance, when the slave power control module 128P identifies a global energy demand in operation 850, with the master power control module 128P operating the master-assigned energy system 152 to satisfy a share of the global energy demand according to operation 830, the slave power control module 128P operates the slave-assigned energy system 152 to satisfy the remaining share of the global energy demand in operation 860. And, when the slave power control module 128P identifies a global propulsion demand in operation 852, with the master power control module 128P operating the master-assigned propulsion system 154 to satisfy a share of the global propulsion demand according to operation 832, the slave power control module 128P operates the slave-assigned propulsion system 154 to satisfy the remaining share of the global propulsion demand in operation 862. Moreover, when the slave power control module 128P identifies a slave-assigned global auxiliary demand in operation 854, the slave power control module 128P operates the slave-assigned auxiliary elements to satisfy the slave-assigned global auxiliary demand in operation 864.

As noted above, in the modularized implementation, with each power module 150 being a modularized version of a complete energy system 152 and a complete propulsion system 154 from another vehicle application, each power control module 128P is sourced from the other vehicle application as well. In relation to the other vehicle application, each sourced power control module 128P is tasked with orchestrating the operation of the complete energy system 152 and the complete propulsion system 154 by itself. Moreover, the sourced power control module 128P is tasked with orchestrating the operation of the auxiliary systems 134 from the other vehicle application by itself.

As-is, in the FCV 100, the sourced power control module 128P would be tasked with gathering information about the FCV 100, including any combination of the information about the FCV 100 detected by the sensor system 122 and information about the FCV 100 communicated from the global control module 128G, and evaluating the information about the FCV 100, including identifying global vehicle demands. Specifically, the sourced power control module 128P would be tasked with identifying one or more global energy demands, one or more global propulsion demands and one or more global auxiliary demands.

When it identified a global vehicle demand, the sourced power control module 128P would be tasked with operating the associated vehicle systems 120 to non-contributorily satisfy the global vehicle demand. For instance, when it identified a global energy demand, the sourced power control module 128P would be tasked with operating the energy system 152 to non-contributorily satisfy the global energy demand. And, when it identified a global propulsion demand, the sourced power control module 128P would be tasked with operating the propulsion system 154 to non-contributorily satisfy the global propulsion demand. Moreover, when it identified a global auxiliary demand, the sourced power control module 128P would be tasked with operating the auxiliary systems 134 on an unassigned basis to satisfy the global auxiliary demand. Relatedly, the sourced power control module 128P would be tasked with conducting operational status checks on the associated vehicle systems 120.

As part of the master/slave control relationship, the slave power control module 128P is sourced from the other vehicle application substantially as-is. The master power control module 128P, on the other hand, although also sourced from the other vehicle application, is modified to promote the appropriate operation of the FCV 100 under the orchestration of the master power control module 128P and the slave power control module 128P. In the FCV 100, the global control module 128G, the master power control module 128P and the slave power control module 128P are communicatively connected to one another. In relation to the process 800, for purposes of gathering information about the FCV 100, the global control module 128G is communicatively connected to the sensor system 122, and the master power control module 128P is communicatively connected to the global control module 128G. The master power control module 128P is communicatively connected to the sensor system 122 as well. The slave power control module 128P, on the other hand, is communicatively connected to the master power control module 128P.

With the master power control module 128P communicatively connected to the global control module 128G and the sensor system 122, the master power control module 128P gathers information about the FCV 100 according to operation 802, including any combination of the information about the FCV 100 detected by the sensor system 122 and information about the FCV 100 communicated from the global control module 128G. Its evaluation of the information about the FCV 100 according to operations 810-816 is thus informed by the "actual" information about the FCV 100, and includes identifying "true" global vehicle demands. In relation to evaluating the information about the FCV 100, as opposed to identifying global auxiliary demands in general, the master power control module 128P is re-tasked with separately identifying the subset master-assigned global auxiliary demands according to operation 814, and slave-assigned global auxiliary demands according to operation 816.

When the master PCU identifies a global vehicle demand according to operations 820-824, as opposed to operating the associated vehicle systems 120 to non-contributorily satisfy the global vehicle demand, the master power control module 128P is re-tasked with operating the master-assigned associated vehicle systems 120 to contributorily satisfy the global vehicle demand according to operations 830-834. For instance, notwithstanding identifying a global energy demand according to operation 820, the master power control module 128P operates the master-assigned energy system 152 to satisfy only a share of the global energy demand according to operation 830. And, notwithstanding identifying a global propulsion demand according to operation 822, the master power control module 128P operates the master-assigned propulsion system 154 to satisfy only a share of the global propulsion demand according to operation 832. Moreover, in relation to separately identifying a master-assigned global auxiliary demand according to operation 824, the master power control module 128P only operates the master-assigned auxiliary elements to satisfy the master-assigned global auxiliary demand according to operation 834. The master PCU is untasked with operating the slave-assigned auxiliary elements. Accordingly, in relation to separately identifying a slave-assigned global auxiliary demand according to operation 826, the process 800 lacks a counterpart to operation 834 for the master PCU to operate the slave-assigned auxiliary elements to satisfy the slave-assigned global auxiliary demand. Relatedly, the master PCU is untasked with conducting operational status checks on the slave-assigned auxiliary elements.

From the perspective of the slave power control module 128P, the master power control module 128P intercepts information about the FCV 100, including any combination of the information about the FCV 100 detected by the sensor system 122 and the information about the FCV 100 communicated from the global control module 128G. To take its place, in operations 870-876, the master power control module 128P generates simulated information about the FCV 100 for the slave power control module 128P. For instance, with the master power control module 128P operating the master-assigned energy system 152 to satisfy a share of the global energy demand according to operation 830, in operation 870, the master power control module 128P generates simulated information about the FCV 100 indicative of a remaining share of the global energy demand. And, with the master power control module 128P operating the master-assigned propulsion system 154 to satisfy a share of the global propulsion demand according to operation 832, in operation 872, the master power control module 128P generates simulated information about the FCV 100 indicative of a remaining share of the global propulsion demand. Moreover, with the master power control module 128P operating the master-assigned auxiliary elements to satisfy the master-assigned global auxiliary demand in operation 834, in operation 874, the master power control module 128P generates simulated information about the FCV 100 indicative of no master-assigned global auxiliary demand. And, with the master power control module 128P untasked with operating the slave-assigned auxiliary elements, but nonetheless separately identifying a slave-assigned global auxiliary demand according to operation 816, in operation 876, the master power control module 128P generates simulated information about the FCV 100 indicative of the slave-assigned global auxiliary demand.

With the slave power control module 128P communicatively connected to the master power control module 128P, the slave power control module 128P gathers information about the FCV 100 according to operation 804, including the simulated information about the FCV 100 communicated from the master power control module 128P. Its evaluation of the information about the FCV 100 according to operations 840-844 is thus informed by the simulated information about the FCV 100, and includes identifying "pretend" global vehicle demands.

In relation to evaluating the information about the FCV 100, notwithstanding being tasked, in principle, with identifying global energy demands according to operation 840, the slave power control module 128P identifies only the remaining share of the global energy demand. And, notwithstanding being tasked, in principle, with identifying global propulsion demands according to operation 842, the slave power control module 128P identifies only the remaining share of the global propulsion demand. Moreover, notwithstanding being tasked, in principle, with identifying global auxiliary demands in general according to operation 844, the slave power control module 128P identifies only the slave-assigned global auxiliary demand.

As noted above, when it identifies a global auxiliary demand, the slave power control module 128P is tasked, in principle, with operating the auxiliary systems 134 on an unassigned basis to satisfy the global auxiliary demand. Accordingly, in principle, when the slave power control module 128P identifies a master-assigned global auxiliary demand in operation 854, in operation 866, the slave power control module 128P operates the master-assigned auxiliary elements to satisfy the master-assigned global auxiliary demand. However, with the slave power control module 128P identifying only the slave-assigned global auxiliary demand according to operation 844, from the perspective of the slave power control module 128P, master-assigned global auxiliary demands do not materialize. And, when the slave power control module 128P does not identify master-assigned global auxiliary demands according to operation 854, the slave power control module 128P does not operate the master-assigned auxiliary elements. Relatedly, the slave power control module 128P does not conduct operational status checks on the master-assigned auxiliary elements. Notably, since the master-assigned auxiliary elements would inevitably fail operational status checks from the perspective of the slave power control module 128P, the slave power control module 128P could otherwise cripple not only the operation of the slave-assigned power module 150, but also the global operation of the FCV 100.

Traction Events.

In relation to the global propulsion demands, with the drivetrain mechanically connected to each propulsion system 154, the propulsion systems 154, on behalf of the power modules 150 to which they belong, are operable to perform propulsion functions, and thereby contributorily satisfy the global propulsion demands. As noted above, the global propulsion demands may include demands to power the wheels 114 and demands to retard the wheels 114. With the propulsion systems 154 operable to power the wheels 114, the propulsion systems 154 are operable to contributorily satisfy demands to power the wheels 114. Moreover, with the propulsion systems 154 operable to retard the wheels 114, the propulsion systems 154 are operable to contributorily satisfy demands to retard the wheels 114.

In many cases, global propulsion demands materialize in relation to driving the FCV 100 along the ground. Specifically, demands to power the wheels 114 materialize in relation to accelerating the FCV 100, as well as maintaining the speed of the FCV 100 on level or uphill ground. Moreover, demands to retard the wheels 114 materialize in relation to decelerating the FCV 100, as well as maintaining the speed of the FCV 100 on downhill ground. Demands to retard the wheels 114, when part of demands to regeneratively brake the FCV, also materialize in relation to braking the FCV. In some cases, global propulsion demands also materialize in relation to traction events or, in other words, evident or prospective losses of tractive contact between the wheels 114 and the ground. Specifically, any combination of demands to power the wheels 114 and demands to retard the wheels 114, either alone or in conjunction with any combination of frictionally braking the FCV 100 and steering the FCV 100, materialize in relation to adjusting the movement of the wheels 114 to maintain, regain or otherwise control tractive contact between the wheels 114 and the ground.

Among other things, it follows that, according to the process 800, when a global propulsion demand materializes, the propulsion systems 154 are operated by different control modules 128 to contributorily satisfy the global propulsion demand. Specifically, the master power control module 128P operates the master-assigned propulsion system 154 to satisfy a share of the global propulsion demand according to operation 832, and the slave power control module 128P operates the slave-assigned propulsion system 154 to satisfy the remaining share of the global propulsion demand in operation 862. Moreover, the control modules are informed by different information about the FCV 100 when identifying the global propulsion demand. Specifically, the master power control module 128P, when identifying the global propulsion demand according to operation 822, is informed by the actual information about the FCV 100 according to operations 802 and 812. The slave power control module 128P, on the other hand, when identifying the remaining share of the global propulsion demand according to operation 852, is informed by the simulated information about the FCV 100 according to operations 804 and 842.

The control modules 128 have a "drive" mode when the control modules 128 do not identify a traction event. In the drive mode, when a global propulsion demand materializes, the propulsion systems 154 are operated according to the process 800 to contributorily satisfy the global propulsion demand. The control modules 128 also have a "traction" mode. When the control modules 128 identify a traction event, the control modules 128 switch to the traction mode. In the traction mode, when a global propulsion demand materializes, the master/slave control relationship according to the process 800 is suspended in favor of one control module 128 operating the propulsion systems 154 according to the process 700 to contributorily satisfy the global propulsion demand. For instance, the control module 128 may be the global control module 128G or the master power control module 128P. In either case, the control module 128 is informed by the same information about the FCV 100 when identifying the global propulsion demand. Specifically, the control module 128, when identifying the global propulsion demand according to operation 706, is informed by only the actual information about the FCV 100 according to operations 702 and 704. When the previously-identified traction event is no longer identified, the control modules 128 switch from the traction mode back to the drive mode.

While recited characteristics and conditions of the invention have been described in connection with certain embodiments, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A vehicle, comprising:
   at least one processor; and
   a memory communicatively coupled to the at least one processor and storing:
   a master power control module including instructions that when executed by the at least one processor cause the at least one processor to:
   monitor for vehicle demands global to the vehicle based on actual information about the vehicle, and thereby identify a propulsion demand global to the vehicle; and
   in response to identifying the propulsion demand:
   operate a master-assigned motor to which a wheeled drivetrain is mechanically connected to satisfy a share of the propulsion demand; and
   generate simulated information about the vehicle for a slave power control module, the simulated information about the vehicle indicative of a remaining share of the propulsion demand; and
   a slave power control module including instructions that when executed by the at least one processor cause the at least one processor to:
   independently monitor for vehicle demands global to the vehicle based on the simulated information about the vehicle, and thereby identify only the remaining share of the propulsion demand; and
   in response to identifying the remaining share of the propulsion demand;
   operate a slave-assigned motor to which the drivetrain is mechanically connected to satisfy the remaining share of the propulsion demand.

2. The vehicle of claim 1, wherein the master-assigned motor and the slave-assigned motor support a common output coupling to which the drivetrain is mechanically connected.

3. The vehicle of claim 1, wherein the propulsion demand is a demand to power at least one wheel in the drivetrain.

4. The vehicle of claim 1, wherein:
the master power control module includes instructions that when executed by the at least one processor cause the at least one processor to:
in response to a demand to generate electrical energy global to the vehicle, operate a master-assigned fuel cell stack to which the master-assigned motor is electrically connected to satisfy a share of the demand to generate electrical energy; and
the slave power control module includes instructions that when executed by the at least one processor cause the at least one processor to:
in response to the demand to generate electrical energy, operate a slave-assigned fuel cell stack to which the slave-assigned motor is electrically connected to satisfy a remaining share of the demand to generate electrical energy.

5. The vehicle of claim 4, wherein by satisfying the share of the demand to generate electrical energy, the master-assigned fuel cell stack generates electrical energy usable to operate the master-assigned motor, and by satisfying the remaining share of the demand to generate electrical energy, the slave-assigned fuel cell stack generates electrical energy usable to operate the slave-assigned motor.

6. The vehicle of claim 4, wherein:
the master power control module includes instructions that when executed by the at least one processor cause the at least one processor to:
monitor for vehicle demands global to the vehicle based on actual information about the vehicle, and thereby identify the demand to generate electrical energy; and
in response to identifying the demand to generate electrical energy:
operate the master-assigned fuel cell stack to satisfy the share of the demand to generate electrical energy; and
generate simulated information about the vehicle for the slave power control module, the simulated information about the vehicle indicative of the remaining share of the demand to generate electrical energy; and
the slave power control module includes instructions that when executed by the at least one processor cause the at least one processor to:
independently monitor for vehicle demands global to the vehicle based on the simulated information about the vehicle, and thereby identify only the remaining share of the demand to generate electrical energy; and
in response to identifying the remaining share of the demand to generate electrical energy:
operate the slave-assigned fuel cell stack to satisfy the remaining share of the demand to generate electrical energy.

7. The vehicle of claim 1, wherein:
the master power control module includes instructions that when executed by the at least one processor cause the at least one processor to:
monitor for vehicle demands global to the vehicle based on actual information about the vehicle, and thereby identify an auxiliary demand global to the vehicle; and
in response to identifying the auxiliary demand:
identify a master-assigned auxiliary demand and a slave-assigned auxiliary demand;
operate a master-assigned auxiliary element to satisfy the master-assigned auxiliary demand; and
generate simulated information about the vehicle for the slave power control module, the simulated information about the vehicle indicative of the slave-assigned auxiliary demand, but not the master-assigned auxiliary demand; and
the slave power control module includes instructions that when executed by the at least one processor cause the at least one processor to:
independently monitor for vehicle demands global to the vehicle based on the simulated information about the vehicle, and thereby identify only the slave-assigned auxiliary demand; and
in response to identifying the slave-assigned auxiliary demand:
operate a slave-assigned auxiliary element to satisfy the slave-assigned auxiliary demand.

8. The vehicle of claim 7, wherein the slave power control module includes instructions that when executed by the at least one processor cause the at least one processor to:
in response to identifying the master-assigned auxiliary demand:
operate the master-assigned auxiliary element to satisfy the master-assigned auxiliary demand; and
in response to operating the master-assigned auxiliary element, conduct an operational status check on the master-assigned auxiliary element.

9. The vehicle of claim 7, wherein the master-assigned auxiliary element and the slave-assigned auxiliary element each belong to at least one of a braking system, a steering system, a heating/cooling system and an accessory system.

10. A method of operating a vehicle, comprising:
using a master power control module:
monitoring for vehicle demands global to the vehicle based on actual information about the vehicle, and thereby identifying a propulsion demand global to the vehicle; and
in response to identifying the propulsion demand:
operating a master-assigned motor to which a wheeled drivetrain is mechanically connected to satisfy a share of the propulsion demand; and
generating simulated information about the vehicle for a slave power control module, the simulated information about the vehicle indicative of a remaining share of the propulsion demand; and
using a slave power control module:
independently monitoring for vehicle demands global to the vehicle based on the simulated information about the vehicle, and thereby identifying only the remaining share of the propulsion demand; and
in response to identifying the remaining share of the propulsion demand:
operating a slave-assigned motor to which the drivetrain is mechanically connected to satisfy the remaining share of the propulsion demand.

11. The method of claim 10, further comprising:
using the master power control module:
in response to a demand to generate electrical energy global to the vehicle, operating a master-assigned fuel cell stack to which the master-assigned motor is electrically connected to satisfy a share of the demand to generate electrical energy; and
using the slave power control module:

in response to the demand to generate electrical energy, operating a slave-assigned fuel cell stack to which the slave-assigned motor is electrically connected to satisfy a remaining share of the demand to generate electrical energy.

12. The method of claim 11, wherein by satisfying the share of the demand to generate electrical energy, the master-assigned fuel cell stack generates electrical energy usable to operate the master-assigned motor, and by satisfying the remaining share of the demand to generate electrical energy, the slave-assigned fuel cell stack generates electrical energy usable to operate the slave-assigned motor.

13. The method of claim 11, further comprising:
using the master power control module:
monitoring for vehicle demands global to the vehicle based on actual information about the vehicle, and thereby identifying the demand to generate electrical energy; and
in response to identifying the demand to generate electrical energy:
operating the master-assigned fuel cell stack to satisfy the share of the demand to generate electrical energy; and
generating simulated information about the vehicle for the slave power control module, the simulated information about the vehicle indicative of the remaining share of the demand to generate electrical energy; and
using the slave power control module:
independently monitoring for vehicle demands global to the vehicle based on the simulated information about the vehicle, and thereby identifying only the remaining share of the demand to generate electrical energy; and
in response to identifying the remaining share of the demand to generate electrical energy:
operating the slave-assigned fuel cell stack to satisfy the remaining share of the demand to generate electrical energy.

14. The method of claim 10, further comprising:
using the master power control module:
monitoring for vehicle demands global to the vehicle based on actual information about the vehicle, and thereby identifying an auxiliary demand global to the vehicle; and
in response to identifying the auxiliary demand:
identifying a master-assigned auxiliary demand and a slave-assigned auxiliary demand;
operating a master-assigned auxiliary element to satisfy the master-assigned auxiliary demand; and
generating simulated information about the vehicle for the slave power control module, the simulated information about the vehicle indicative of the slave-assigned auxiliary demand, but not the master-assigned auxiliary demand; and
using the slave power control module:
independently monitoring for vehicle demands global to the vehicle based on the simulated information about the vehicle, and thereby identifying only the slave-assigned auxiliary demand; and
in response to identifying the slave-assigned auxiliary demand:
operating a slave-assigned auxiliary element to satisfy the slave-assigned auxiliary demand.

15. The method of claim 14, further comprising:
using the slave power control module:
in response to identifying the master-assigned auxiliary demand:
operating the master-assigned auxiliary element to satisfy the master-assigned auxiliary demand; and
in response to operating the master-assigned auxiliary element, conducting an operational status check on the master-assigned auxiliary element.

16. A vehicle, comprising:
at least one processor; and
a memory communicatively coupled to the at least one processor and storing:
a master power control module including instructions that when executed by the at least one processor cause the at least one processor to:
monitor for vehicle demands global to the vehicle based on actual information about the vehicle, and thereby identify an auxiliary demand global to the vehicle; and
in response to identifying the auxiliary demand:
identify a master-assigned auxiliary demand and a slave-assigned auxiliary demand;
operate a master-assigned auxiliary element to satisfy the master-assigned auxiliary demand; and
generate simulated information about the vehicle for a slave power control module, the simulated information about the vehicle indicative of the slave-assigned auxiliary demand, but not the master-assigned auxiliary demand; and
a slave power control module including instructions that when executed by the at least one processor cause the at least one processor to:
independently monitor for vehicle demands global to the vehicle based on the simulated information about the vehicle, and thereby identify only the slave-assigned auxiliary demand; and
in response to identifying the slave-assigned auxiliary demand:
operate a slave-assigned auxiliary element to satisfy the slave-assigned auxiliary demand.

17. The vehicle of claim 16, wherein the slave power control module includes instructions that when executed by the at least one processor cause the at least one processor to:
in response to identifying the master-assigned auxiliary demand:
operate the master-assigned auxiliary element to satisfy the master-assigned auxiliary demand; and
in response to operating the master-assigned auxiliary element, conduct an operational status check on the master-assigned auxiliary element.

18. The vehicle of claim 16, wherein the master-assigned auxiliary element and the slave-assigned auxiliary element each belong to at least one of a braking system, a steering system, a heating/cooling system and an accessory system.

* * * * *

UNITED STATES PATENT AND TRADEMARK OFFICE
CERTIFICATE OF CORRECTION

PATENT NO. : 10,518,652 B2
APPLICATION NO. : 15/938724
DATED : December 31, 2019
INVENTOR(S) : Brown et al.

Page 1 of 1

It is certified that error appears in the above-identified patent and that said Letters Patent is hereby corrected as shown below:

In the Specification

Column 10, Line 29: replace "contributorily satisfy" with --satisfy--
Column 11, Line 35: replace "new applications" with --new vehicle applications--
Column 11, Line 44: replace "new applications" with --new vehicle applications--
Column 11, Line 47: replace "new applications" with --new vehicle applications--
Column 14, Line 66: replace "generates electrical energy" with --generate electrical energy--
Column 17, Line 60: replace "brakes" with --friction brakes--
Column 20, Line 3: replace "brakes" with --friction brakes--
Column 23, Lines 3-4: replace "global propulsion demands" with --global vehicle demands--
Column 25, Line 47: replace "networks 302" with --network 320--
Column 29, Line 24: replace "master PCU" with --master power control module 128P--
Column 29, Line 60: replace "slave PCU" with --slave power control module 128P--
Column 31, Line 30: replace "master PCU" with --master power control module 128P--
Column 31, Line 51: replace "master PCU" with --master power control module 128P--
Column 31, Line 55: replace "master PCU" with --master power control module 128P--
Column 31, Lines 57-58: replace "master PCU" with --master power control module 128P--

In the Claims

Column 34, Line 60: replace ";" with --:--

Signed and Sealed this
Twenty-fourth Day of March, 2020

Andrei Iancu
*Director of the United States Patent and Trademark Office*